(12) United States Patent
Udrea et al.

(10) Patent No.: US 12,483,239 B2
(45) Date of Patent: Nov. 25, 2025

(54) SEMICONDUCTOR SWITCH COMPRISING A SHORT-CIRCUIT DETECTION CIRCUIT

(71) Applicant: Cambridge GaN Devices Limited, Cambridge (GB)

(72) Inventors: Florin Udrea, Cambridge (GB); Wai Hon Ng, Cambridge (GB); Sheung Wai Fung, Cambridge (GB); Loizos Efthymiou, Cambridge (GB); John Findlay, Cambridge (GB); Martin Arnold, Cambridge (GB); Zahid Ansari, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 68 days.

(21) Appl. No.: 18/394,141

(22) Filed: Dec. 22, 2023

(65) Prior Publication Data
US 2025/0211226 A1    Jun. 26, 2025

(51) Int. Cl.
*H03K 17/687* (2006.01)

(52) U.S. Cl.
CPC .............................. *H03K 17/6871* (2013.01)

(58) Field of Classification Search
CPC .................................................. H03K 17/6871
See application file for complete search history.

(56) References Cited

U.S. PATENT DOCUMENTS

| | | | |
|---|---|---|---|
| 9,870,939 B2 * | 1/2018 | Linewih | H02H 9/04 |
| 10,818,786 B1 | 10/2020 | Udrea et al. | |
| 11,082,039 B2 * | 8/2021 | Chen | H10D 30/4755 |
| 2008/0100378 A1 * | 5/2008 | Bernacchia | H02M 7/5388 |
| | | | 327/589 |
| 2016/0313378 A1 * | 10/2016 | Duvjnak | G01R 19/0084 |
| 2018/0191239 A1 * | 7/2018 | Hokazono | H02M 1/08 |

(Continued)

OTHER PUBLICATIONS

Schmitz et al: "Rugged and fast short circuit detection method for GaN HEMT based on saturation detection," CIPS 2022; 12th International Conference on Integrated Power Electronics Systems, Berlin, Germany, 2022, pp. 313-318.

(Continued)

*Primary Examiner* — Metasebia T Retebo
(74) *Attorney, Agent, or Firm* — Tarolli, Sundheim, Covell & Tummino LLP

(57) ABSTRACT

A semiconductor switch comprising a first main terminal, a second main terminal, and a control terminal, the semiconductor switch further comprising: a III-nitride high-electron-mobility transistor (HEMT), the III-nitride HEMT comprising a first source terminal, a first drain terminal, and a first gate terminal; a first interface circuit operatively connected to the control terminal and to the first gate terminal; and a short-circuit detection circuit operatively connected to the first drain terminal and the first source terminal, the short-circuit detection circuit being configured to: sense a short-circuit across the first drain terminal and the first source terminal; and transmit a short-circuit detection signal to the first interface circuit, the first interface circuit being configured, upon receipt of the short-circuit detection signal, to cause the III-nitride HEMT to turn off, and/or to cause a voltage across the first gate terminal to be reduced.

26 Claims, 27 Drawing Sheets

(56) References Cited

U.S. PATENT DOCUMENTS

2023/0131602 A1   4/2023   Arnold et al.

OTHER PUBLICATIONS

Saumitra: "Ultrafast Discrete Short-Circuit Protection for GaN HEMTs," GaN HEMTs' Protection Circuits—Power Electronics News, Feb. 28, 2023, 6 pgs.

Luxembourg Search Report and Written Opinion for LU application No. 505903, dated Jul. 1, 2024, 11 pages.

* cited by examiner

SEMICONDUCTOR SWITCH COMPRISING A SHORT-CIRCUIT DETECTION CIRCUIT

TECHNICAL FIELD

The present disclosure relates to a semiconductor switch, in particular a semiconductor switch comprising a III-nitride high-electron-mobility transistor (HEMT), the semiconductor switch comprising a short-circuit detection circuit.

BACKGROUND

Gallium Nitride (GaN) is a wide band gap material with properties that make it a suitable candidate for use in several fields of application (e.g. radio-frequency electronics, optoelectronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems/

Additionally, GaN with its wide bandgap offers the potential for emitting light at higher frequencies for example the green, blue, violet, and ultraviolet portions of the electromagnetic spectrum.

Gallium Nitride (GaN) has been more recently considered as a very promising material for use in the field of power devices. The application areas range from portable consumer electronics, solar power inverters, electric vehicles, and power supplies. The wide band gap of the material (Eg=3.39 eV) results in high critical electric field (Ec=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters. One common parameter used to compare power semiconductor transistors is Specific ON-state resistance or Specific Rds(ON). Where specific Rds(ON) is often the product of the resistance of a device times the area of the device on wafer. An extensive amount of research has focused on the development of power devices using AlGaN/GaN heterostructures.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures and use of a p-type cap layer. Due to the relative maturity and controllability in the epitaxial growth of pGaN layers compared to the other techniques, pGaN/AlGaN/GaN HEMTs are currently the leading structure for commercialization. The high-frequency operation of GaN helps designers to increase the power density of devices, which in turn increases the system efficiency and results in cost savings. High power density and system efficiency are specifically advantageous for high power applications. High power applications such as motor control, inverters, etc. require enhanced short-circuit immunity. But the increased frequency of operation results in challenges for designing short-circuit and overcurrent protection circuits for these GaN HEMTs. In addition, in motor control applications enhanced short-circuit endurance is highly desirable. For example in half bridge configuration when the low-side and high side devices operate at different times in ON and OFF states, if due to a fault both devices are ON, a short-circuit may be present. This may be detected and a signal can be transmitted to the controller/driver to turn devices off.

The traditional methods for short-circuit protection in silicon-based power devices such as IGBTs, by using external circuits for example a desaturation circuit which senses when the device is in saturation have a delay time of in the range of 2-10 µs, which may be too high for GaN HEMTs to survive [1]. GaN HEMTs could fail under short circuit condition at high dc-link voltages in several hundred nanoseconds [2]. The shorter fail times for power GaN HEMTs, compared to other competing technologies such as IGBTs and SiC MOSFETs, is associated with the improved specific Ron of the device as well as the lateral configuration of the device. Given the shorter fail time for GaN HEMTs, methods of short circuit protection which can detect a short circuit event and protect the device in a shorter time frame are required.

Methods of short circuit detection may involve current or voltage sensing, which may have advantages and disadvantages. A shunt current-sensing resistor adds additional parasitic inductance into the circuit, which can negatively affect the switching performance of the GaN HEMTs as well as the on-state losses. Voltage sensing across common source inductance (or resistance) is not practical for GaN, as active steps are taken to reduce stray inductance in a GaN circuit to improve switching performance and at the same time not compromise on-state losses. Therefore, alternative methods for short-circuit and overcurrent protection are desired for GaN devices. Recent research proposes a discrete short-circuit/overcurrent circuit for protection, but they are either limited to low-power circuits or require components that are not practically feasible. Monolithic integration of such functionality rather than a discrete implementation would allow a reduction in the overall system size/costs, a reduction in the bill of material and would lead to improved performance through the reduction of parasitic components associated with the interconnections between discrete devices.

U.S. Pat. No. 10,818,786 provides an over-current protection and sensing circuitry utilising a current sense transistor (Sense HEMT) that may be integrated monolithically with the main power switch. The Sense HEMT can communicate with a Miller clamp to lower the voltage on the gate of the GaN power HEMT.

SUMMARY

It is desirable for robust and reliable operation of a III-nitride (e.g. GaN) power IC (or also referred to as GaN chip), to have a fast and rugged short-circuit detection and protection method. Protection circuits proposed by the prior-art require additional sensing components to be added to the circuit and/or have longer detection and protection times which are unsuitable for the protection of power GaN HEMTs.

It is an object of the present disclosure to provide a short-circuit detection circuit (which may form part of a short-circuit protection circuit) that uses minimal components and provides ultra-fast protection against short circuit events. This may be achieved through a power integrated circuit that includes a power HEMT, a Miller clamp, an auxiliary GaN HEMT connected to the gate of the power HEMT and a short circuit detection block. As these components are already monolithically integrated with the power HEMT, the proposed method provides a simple and cost-effective solution.

The short-circuit detection circuit may, via a short-circuit detection signal, cause the power HEMT to turn off, and/or cause a gate bias of the power HEMT to be reduced.

Short circuit events may be divided into at least two categories, which are described commonly as a type 1 short circuit even and a type 2 short circuit event. An effective short circuit protection solution is required to be effective in protecting the device for both type 1 and type 2. The protection time for a type 2 short circuit event may need to be shorter than the reaction time for a type 1 short circuit event. As such an additional circuit block may be implemented specifically for type 2 short circuit.

Described herein is a semiconductor switch comprising a first main terminal, a second main terminal, and a control terminal, the semiconductor switch further comprising:
  a III-nitride high-electron-mobility transistor (HEMT), the III-nitride HEMT comprising a first source terminal, a first drain terminal, and a first gate terminal;
  a first interface circuit operatively connected to the control terminal and to the first gate terminal; and
  a short-circuit detection circuit operatively connected to the first drain terminal and the first source terminal, the short-circuit detection circuit being configured to:
  sense a short-circuit across the first drain terminal and the first source terminal; and
  transmit a short-circuit detection signal to the first interface circuit, the first interface circuit being configured, upon receipt of the short-circuit detection signal, to cause the III-nitride HEMT to turn off, and/or to cause a voltage across the first gate terminal to be reduced.

The III-nitride HEMT may be referred to as a "high-voltage HEMT", and/or a "power HEMT".

It will be understood that the terms "first", "second", "third", and so on, with respect to terminals and circuits etc. as used herein are merely arbitrary designations to provide clarity.

A "III-nitride" transistor (e.g. HEMT), device, or integrated circuit, as used herein, may refer generally to a transistor or device based on the group III-nitride family of materials, including GaN, AlN, InN, and alloys thereof.

In some examples, the first interface circuit comprises a pull-down transistor (e.g. a Miller clamp), and/or a voltage limiter. The pull-down transistor may be a "low-voltage" HEMT. The pull-down transistor may be a III-nitride transistor.

In an example, the first interface circuit comprises a pull-down transistor, the pull-down transistor comprising a second source terminal and a second drain terminal; wherein the second drain terminal is operatively connected to the first gate terminal; wherein the second source terminal is operatively connected to the first source terminal; and
  wherein the pull-down transistor is configured, when the first interface circuit receives the short-circuit detection signal, to turn on.

The pull-down transistor can be controlled via its gate terminal (designated herein as a "second gate terminal").

The short-circuit detection signal may be provided directly to the second gate terminal to control the pull-down transistor (e.g. the first interface circuit may be configured to receive the short-circuit detection signal at the second gate terminal).

In some examples, the first interface circuit comprises a pull-down transistor gate driver (e.g. a gate driver circuit) operatively connected to the second gate terminal and configured to drive the second gate terminal. In such cases, the short-circuit detection signal may be provided to the pull-down transistor gate driver (e.g. the first interface circuit may be configured to receive the short-circuit detection signal at the pull-down transistor gate driver).

The first interface circuit may comprise an auxiliary gate interface circuit. The auxiliary gate interface circuit may comprise a voltage limiter. The auxiliary gate interface circuit may comprise an auxiliary III-nitride HEMT (which may be referred to as a low-voltage HEMT). The auxiliary gate interface circuit may comprise a voltage limiter. The auxiliary III-nitride HEMT may comprise: a third source terminal operatively connected to the first gate terminal; a third drain terminal operatively connected to the control terminal; and a third gate terminal operatively connected to the voltage limiter. The voltage limiter may be configurable to limit a voltage across the first gate terminal and the first source terminal. For example, the short-circuit detection signal may be received at the first interface circuit. The first interface circuit may be configured, upon receipt of the short-circuit detection signal, to cause the voltage limiter to limit the voltage across the first gate terminal and the first source terminal to e.g. a voltage to a lower gate voltage than during normal operation. E.g. the voltage limiter may be caused to reduce the voltage across the first gate terminal and the first source terminal.

It will be understood that, in some examples, the short-circuit detection signal may be received at both the pull-down transistor (second gate terminal and/or pull-down transistor gate driver), and the auxiliary gate interface circuit of the first interface circuit.

The semiconductor switch may comprise one or more signal conditioning circuits configured to condition the short-circuit detection signal. The signal conditioning circuit(s) may be provided in one or more signal conditioning blocks.

Examples of signal conditioning circuits include: latch circuits; a diode with a cathode terminal connected to the second gate terminal (i.e. of the pull-down transistor); a transistor-like diode; resistors and/or capacitors; a logic inverter; a buffer; and/or a level shifter.

In some examples, the semiconductor switch comprises a latch circuit. A latch circuit may be configured to condition the short-circuit detection signal. For example, the latch circuit may be configured or arranged to receive and adjust the short-circuit detection signal during transmission of the short-circuit detection signal from the short-circuit detection circuit to the first interface circuit (e.g. the latch circuit may be arranged in a signal path of the short-circuit detection signal).

The latch circuit may be configured to provide a conditioned short-circuit detection signal which is held in a given state until one or more release conditions is met (i.e. the latch circuit may maintain a conditioned short-circuit detection signal to the interface circuit even if the short circuit condition is not present in the HEMT, until the one or more release conditions is met). The one or more release conditions may comprise, for example, expiry of a time period (i.e. the latch circuit may hold the conditioned short-circuit detection signal for the time period). In some examples, the time period may be in a range from 1 to 500 microseconds.

Alternatively, or in addition, the one or more release conditions may be dependent on a signal, for example a signal applied to the control terminal of the semiconductor switch. The signal to the control terminal of the semiconductor switch may be provided by a gate driver (or a controller), as is typical in power electronics circuits. The signal from the gate driver of the semiconductor switch, which releases the latch, may be from high-to-low indicating that the gate driver is turning off the semiconductor switch which will remove the short circuit condition present in the HEMT.

The short-circuit detection circuit may comprise a desaturation circuit configured to detect a voltage drop across the first drain terminal and the first source terminal. The desaturation circuit may comprise at least one blanking resistor and at least one blanking capacitor. A time constant of the desaturation circuit may be defined as a product of a resistance of the at least one blanking resistor and a capacitance of the at least one blanking capacitor. The desaturation circuit may be configured to detect when the III-nitride HEMT ("high voltage HEMT") is in saturation. The desaturation circuit may be configured to detect when a certain voltage drop across the first drain and first source terminals is reached. The certain voltage drop may be significantly higher than an on-state voltage drop (e.g. 2 V) but considerably lower than a rated blocking voltage (e.g. 650 V). For example, the certain voltage drop may be around 10 V.

In some examples, the voltage drop is between 5 V and 30 V. In some examples, the time constant is between 50 ns and 1 microsecond.

The short-circuit detection circuit may comprise a resistor-capacitor (RC) network (e.g. a resistor and a capacitor arranged in a loop). The short-circuit detection circuit may further comprise a HEMT referred to as a sense HEMT. The sense HEMT may have an identical geometry and architecture to the III-nitride HEMT ("high voltage HEMT") described herein, but may have a relatively reduced gate width, or area, in comparison to the III-nitride HEMT ("high voltage HEMT"). The sense HEMT may comprise one or more III-nitride materials.

The sense HEMT may comprise: a fourth source terminal operatively connected to the RC network; a fourth drain terminal operatively connected to the first drain terminal; and a fourth gate terminal operatively connected to the first gate terminal.

The fourth source terminal may be further operatively connected (e.g. directly connected, or through an interface) to the second gate terminal (i.e. the gate terminal of the pull-down transistor). The sense HEMT may be configured to detect a voltage drop (resulting from a short-circuit) across the RC network, and may be further configured to turn on the pull-down transistor upon detection of the voltage drop. As an example, the voltage drop may be between 2 V and 5 V.

The short-circuit detection circuit may comprise: a voltage detection circuit configured to compare a voltage across the first drain terminal and the first source terminal with a reference voltage, and to output a high voltage detection signal when the voltage across the first drain terminal and the first source terminal is above the reference voltage; and a blanking time circuit configured to output a blanking time signal after a blanking time period has elapsed.

The short-circuit detection circuit may be configured to transmit the short-circuit detection signal based on the high voltage detection signal and the blanking time signal (e.g. based on a combination of the high voltage detection signal and the blanking time signal). For example, the short-circuit detection circuit may further comprise a logical combination circuit configured to receive the high voltage detection signal and the blanking time signal, and to output the short-circuit detection signal based on a combination of the high voltage detection signal and the blanking time signal.

The voltage detection circuit may be enabled by the output of the blanking time circuit to output a high voltage detection signal indicating a short-circuit detection.

The voltage detection circuit may comprise a differential comparator circuit configured to compare the voltage across the first drain terminal and the first source terminal (which may be provided as an input voltage to the differential comparator circuit) with the reference voltage.

Any of the short-circuit detection circuit, the pull-down transistor, the auxiliary HEMT, the interface(s), and/or the voltage limiter may be monolithically integrated.

Any of the above-mentioned resistors, capacitors, and/or RC network may be monolithically integrated with the III-nitride HEMT. In some examples, one or more resistors or capacitors may be provided externally (e.g. one of the resistor and the capacitor of the RC network may be provided on-chip, and the other may be off-chip).

In an example, the first interface circuit comprises an additional pull-down transistor (e.g. the first interface circuit may comprise the additional pull-down transistor), the additional pull-down transistor comprising a fifth source terminal and a fifth drain terminal; wherein the fifth drain terminal is operatively connected to the first gate terminal; and wherein the fifth source terminal is operatively connected to the first source terminal. The additional pull-down transistor may be configured, or optimized, for control of the III-nitride HEMT in the absence of a short-circuit condition, and in operation of the III-nitride HEMT in other conditions such as normal switching (for example device turn-off) and the avoidance of false turn-on events (for example operating as an active Miller clamp). For example, the additional pull-down transistor may have a larger area or gate width in comparison to the (other) pull-down transistor. For example, the additional pull-down transistor may have a lower on-state resistance than the (other) pull-down transistor.

The additional pull-down transistor may be a "low-voltage" HEMT. The additional pull-down transistor may be a III-nitride transistor. The additional pull-down transistor may be a Miller clamp.

In some examples, the short-circuit detection circuit is configured to detect a fast positive change in voltage with time (dV/dt) across the first drain terminal and the first source terminal. Such a fast dV/dt may indicate a type 2 short-circuit event.

The semiconductor switch may comprise a second short-circuit detection circuit.

The second short-circuit detection circuit may be configured to detect a positive change in voltage with time across the first drain terminal and the first source terminal; and the second short-circuit detection circuit may configured to transmit a (e.g. second) short-circuit detection signal when the positive change in voltage with time exceeds a reference rate. For example, the reference rate may be 150 V/ns.

The (second) short circuit detection signal generated by the second short circuit detection circuit can be received by the first interface circuit.

In some examples, the semiconductor switch is a cascode.

In some examples, the semiconductor switch is a parallel connection of multiple III-nitride switches.

In some examples, the semiconductor switch is a series combination of III-nitride switches with a level shifter.

In some examples, the semiconductor switch is a combined switch additionally comprising a low voltage auxiliary HEMT, the low voltage auxiliary HEMT comprising an auxiliary HEMT source terminal, an auxiliary HEMT drain terminal, and an auxiliary HEMT gate terminal; a voltage limiter operatively connected to the auxiliary HEMT gate terminal; and a high voltage transistor device, the high voltage transistor device comprising a first transistor device terminal, a second transistor device terminal, and a transistor device gate terminal; wherein the auxiliary HEMT source terminal is operatively connected to the high voltage HEMT gate terminal; wherein the high voltage HEMT source terminal and the first transistor device terminal are operatively connected to the first main terminal; wherein the high voltage HEMT drain terminal and the second transistor device terminal are operatively connected to the second main terminal; wherein the auxiliary HEMT drain terminal and the high voltage transistor device gate terminal are operatively connected to the control terminal; and wherein the voltage limiter is operatively connected to the high voltage HEMT source terminal and to the auxiliary HEMT gate terminal, further wherein the voltage limiter is configured configurable to limit a voltage across the high voltage HEMT gate terminal and the high voltage HEMT source terminal.

The high voltage transistor device may comprise a silicon and/or silicon carbide transistor.

The high voltage transistor device may comprise an insulated-gate bipolar transistor (IGBT). The first transistor device terminal may comprise an IGBT emitter terminal. The second transistor device terminal may comprise an IGBT collector terminal.

The high voltage transistor device may comprises a metal-oxide-semiconductor field-effect transistor (MOSFET). The transistor device terminal may comprise a MOSFET source terminal. The second transistor device terminal may comprise a MOSFET drain terminal.

The high voltage transistor device may comprise a superjunction. The first transistor device terminal may comprise a superjunction source terminal. The second transistor device terminal may comprise a superjunction drain terminal.

Also described herein is a system comprising a semiconductor switch as described herein, and an external gate driver (or controller). The external gate driver/controller may be configured to control the III-nitride HEMT (e.g. the external gate driver may be operatively connected to the first gate terminal). The short-circuit detection circuit may be configured to transmit the short-circuit detection signal to the external gate driver. For example, the short-circuit detection signal may be provided to the external gate driver/controller as a fault signal. The external gate driver/controller may register that the semiconductor switch is experiencing a short-circuit condition.

The external gate driver may be configured to cause the semiconductor switch to turn off, upon receipt by the external gate driver of the short-circuit detection signal. The external gate driver may therefore provide additional protection to the III-nitride HEMT. For example, the short-circuit protection circuit (which may be on-chip, and/or monolithically integrated with the III-nitride HEMT) may protect the III-nitride HEMT until sufficient time has elapsed to report the fault to the external gate driver/controller.

The short-circuit detection circuit may be configured to reset upon receipt of a reset signal from the external gate driver/controller. For example, the reset of a latch in the short-circuit detection circuit may be dependent on receipt of the reset signal. The reset signal may be a first high-to-low signal, or a count of a subsequent number of signals.

Additionally described herein is a system comprising a plurality of semiconductor switches connected in parallel;
wherein a first semiconductor switch of the plurality of semiconductor switches comprises a first parallel mode detection circuit;
wherein a second semiconductor switch of the plurality of semiconductor switches comprises a second parallel mode detection circuit; and
wherein the short-circuit detection circuit of the first semiconductor switch is configured to transmit the short-circuit detection signal to the first parallel mode detection circuit, and wherein the first parallel mode detection circuit is configured, upon receipt of the short-circuit detection signal, to transmit a detection signal to the second parallel mode detection circuit; and
wherein the second parallel mode detection circuit is configured, upon receipt of the detection signal, to cause the second semiconductor switch to turn off.

For example, a plurality of semiconductor switches may all be connected in parallel, each of the semiconductor switches comprising a parallel mode detection circuit, all of the parallel mode detection circuits being connected to each other. If any short-circuit detection circuit of one of the plurality of semiconductor switches detects a short-circuit, it may cause the respective semiconductor switch to turn off. At the same time, a signal detection signal will be sent to the other semiconductor switches in the plurality of semiconductor switches to cause them to turn off as well.

In some examples, a semiconductor switch may comprise one or more of a cascode device; and/or a combined switch comprising a III-nitride switch in parallel to a high-voltage transistor switch made up of a material other than III-nitride.

BRIEF DESCRIPTION OF THE DRAWINGS

The present invention will now be described by way of example with reference to the following drawings.

DETAILED DESCRIPTION

Figure 1:
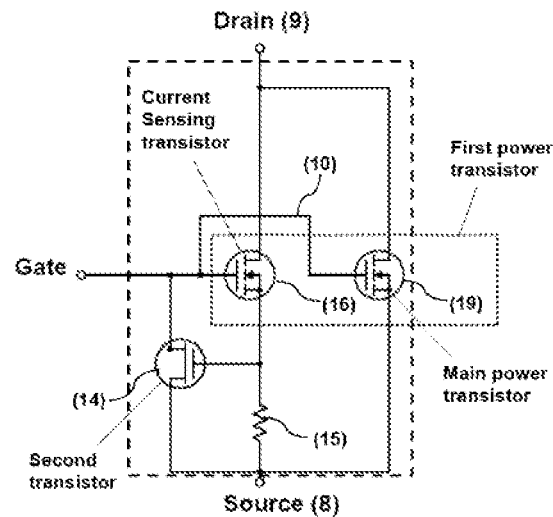
FIG. 1 illustrates a schematic circuit diagram of an over-current protection circuit according to U.S. Pat. No. 10,818,786B1.

FIG. 1 illustrates a schematic circuit diagram of an over-current protection circuit according to U.S. Pat. No. 10,818,786B1, the contents of which is hereby incorporated by reference in its entirety. U.S. Pat. No. 10,818,786B1 describes a resistor and an actively switched low voltage depletion mode transistor (second transistor) controlling the potential on the gate terminal of the main power transistor. The over-current protection circuit includes a first power transistor 19 composed of a current sensing transistor 16 and a main power transistor 19, a depletion mode transistor (second transistor) 14, and a current sensing resistor 15.

The circuit acts to lower or limit the gate voltage on the first power transistor 19 when a condition of over drain current is detected in the current sensing transistor 16, by using the depletion mode device 14 and the resistor 15 or resistive element described above. If a condition of overcurrent is detected the voltage drop across current sensing resistor 15 increases and thus the voltage bias on the gate terminal of transistor 14 increases causing a sharp decrease in resistance of transistor 14. This provides a reduction in the resistance of the path between the gate and source of the first power device 16, 19 thus limiting the potential on the first gate terminal.

Figure 2:
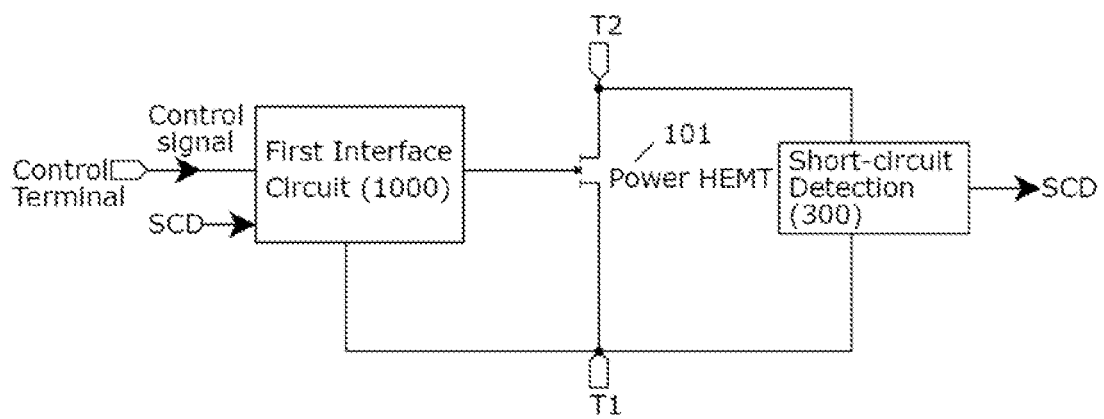
FIG. 2 schematically illustrates an example of a semiconductor switch according to the present disclosure.

FIG. 2. The semiconductor switch comprises featuring a high-voltage III-nitride power HEMT 101, a (first) interface circuit 1000 which has at least one connection to the control terminal and at least one connection to the internal gate of the high voltage HEMT and a short-circuit detection circuit 300 which has at least one connection to the drain of the HEMT, at least one connection to the source of the HEMT and at least one connection to the interface circuit. In an example according to the present disclosure, the III-nitride power HEMT is a high voltage lateral GaN HEMT. The interface circuit 1000 is placed in front of the gate of the high voltage lateral GaN HEMT to adapt the driving voltage of the control terminal to that suitable and allowable for the GaN HEMT. This interface could be preferably monolithically integrated with the power HEMT for providing lower parasitics, ease of manufacturing and fast reaction time. Alternatively this interface could be part of a separate chip (such as a silicon companion chip, or a driver chip). For example, the driving voltage on the control terminal could be from 0V to 20 V while the driving voltage seen directly by the gate terminal of the lateral high voltage GaN HEMT remains 0 to 7V.

Figure 3:
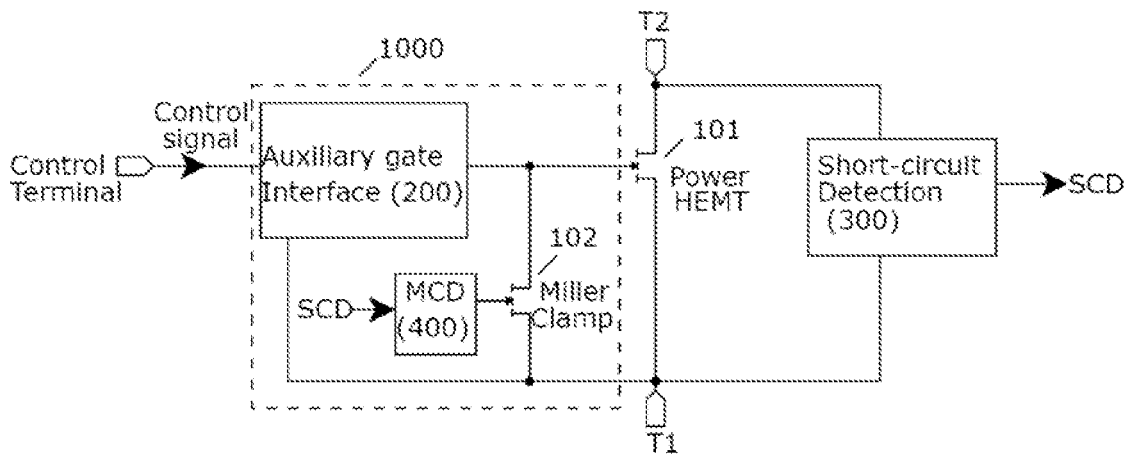
FIG. 3 illustrates an example of a semiconductor switch comprising a Miller clamp transistor and an auxiliary gate interface.

As shown in FIG. 3, the first interface circuit 1000 may comprise a Miller clamp transistor 102 and/or an auxiliary gate interface 200.

The Miller clamp transistor 102 may be connected between the gate and the source of the power HEMT that acts as a pull-down device to ensure a fast and safe turn-off, to enhance immunity against dV/dt and to avoid the need for using negative gate voltages to turn-off the power HEMT. As another example, the output signal of the short circuit detection block 300 may act as an input to the gate of the Miller clamp transistor (or the gate driver of the Miller clamp transistor-MCD) such that the Miller clamp turns-on and turns-off the power HEMT when a short circuit is detected.

Figure 4:
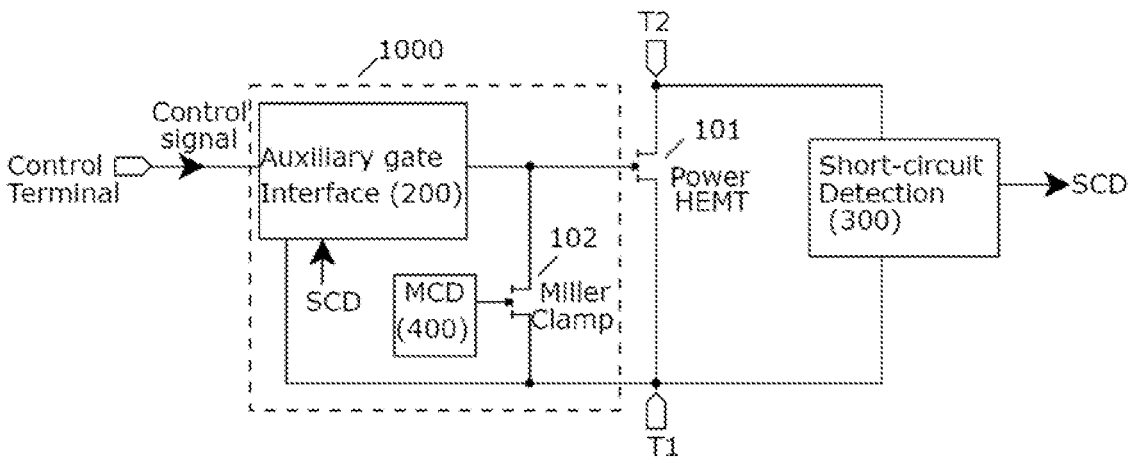
FIG. 4 illustrates a semiconductor switch comprising an auxiliary gate interface comprising a short-circuit protection function.

As shown in FIG. 4, the auxiliary gate interface 200 may contain a short-circuit protection function. The interface may further contain other clamping circuits, sensing and protection functions, pull-down devices to ensure a fast and safe turn-off, to enhance immunity against dV/dt and to absorb any transient voltage peaks on the gate. The short circuit detection block is configured to change its output signal when a short circuit is detected across the power HEMT, for example having a low output signal when a short circuit is not detected and a high output signal when a short circuit is detected. The short circuit output signal may act as an input to the auxiliary gate interface block such that the auxiliary gate interface block acts to turn-off the power HEMT or regulate the voltage on the gate terminal of the power HEMT to a reduced voltage. Reducing the bias of the gate terminal of the power HEMT may be beneficial in extending the time for which the power HEMT can survive a short circuit event, as a reduced gate bias can lead to reducing the saturation current of the power HEMT in a short circuit condition.

Figure 5:
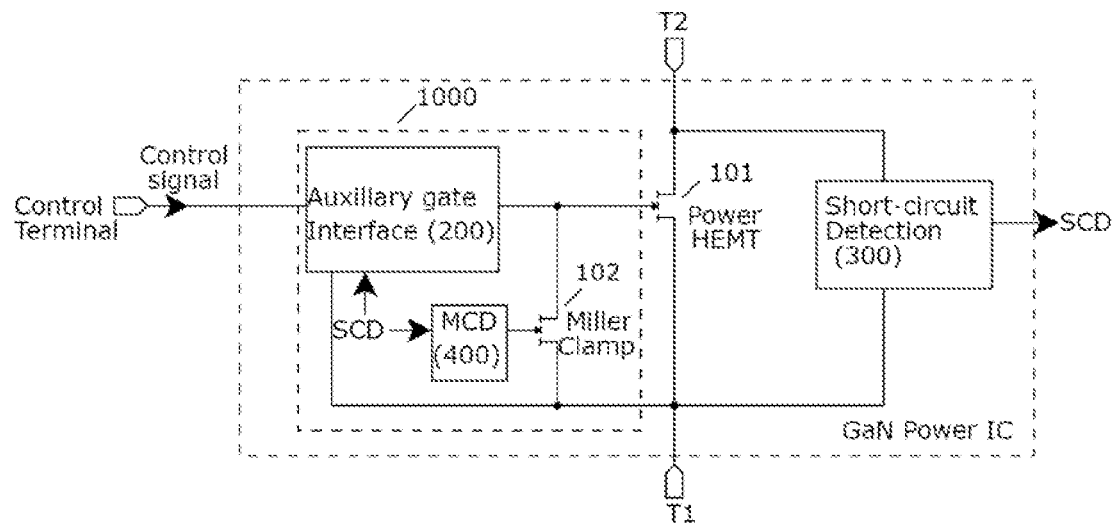
FIG. 5 illustrates a semiconductor switch in which the short circuit detection signal acts as an input to both a Miller clamp drive/transistor and an auxiliary gate interface.

In some examples, as illustrated in FIG. 5, the short circuit detection signal may act as an input to both the Miller clamp drive/transistor and the auxiliary gate interface block 200.

The output of the short circuit detection block may be applied directly to the aforementioned circuit blocks or may be applied indirectly via some additional circuit blocks, for example a signal condition block and/or a latch circuit block. Embodiments of these additional circuit blocks will be described herein. As an example, these additional circuit blocks may be monolithically integrated with the power HEMT device forming a GaN Power IC.

Figure 6:
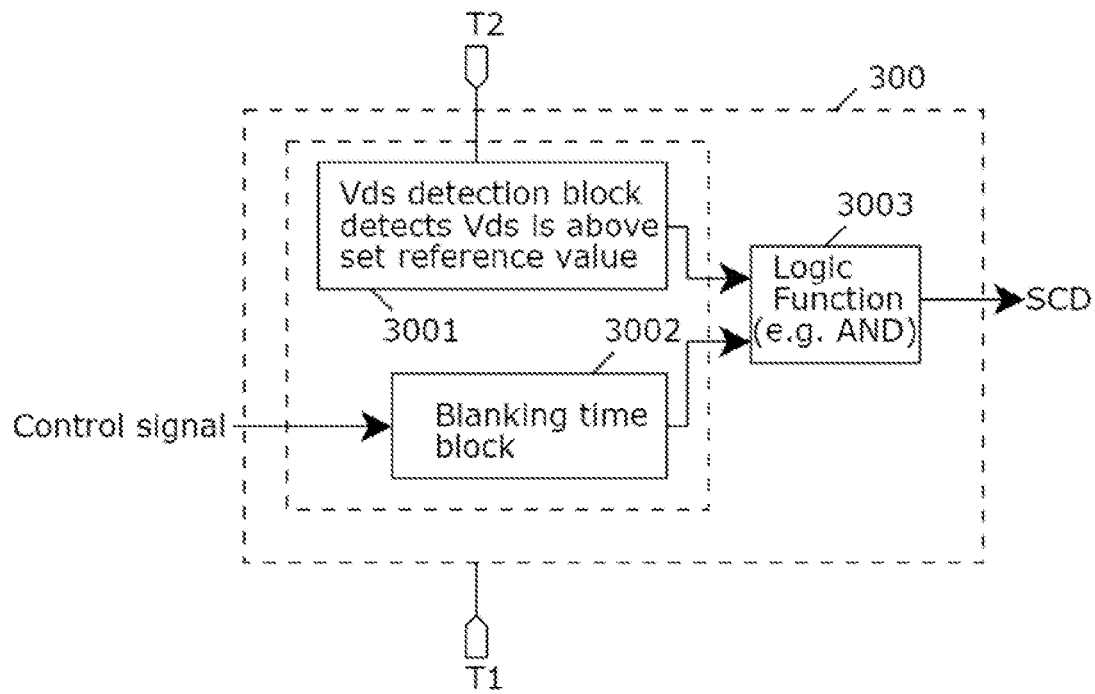
FIG. 6 illustrates an example of the block diagram of a short-circuit detection circuit.

FIG. 6 illustrates a schematic example of sub-blocks of the short circuit detection block 300. The short circuit detection block may be configured to comprise a Vds detection block 3001 which can detect that the power HEMT may be in short circuit by detecting whether drain-to-source voltage (Vds) across the device is above a set reference value. Nevertheless, the condition of the drain-to-source voltage of the device exceeding a set reference value is not only present during a short circuit event but rather may also be present during the power HEMT off-state. Furthermore, Vds may also exceed the set reference value for a short time period during the device switching events. In order to avoid 'false triggering' the short circuit detection circuit by detecting a short circuit event when one is not present, a blanking time block may be configured. The blanking time block 3002 may output a signal after a set amount of time has elapsed. The control signal of the power HEMT may be used as an input to the blanking time block such that the time measurement only commences when the control signal indicates that the power HEMT is in the ON-state condition.

The output of the Vds detection block and the blanking time block may be used to detect whether a short circuit event has occurred in the power HEMT. An AND function may be suitable, for example such that a short circuit is detected only when Vds exceeds a reference value and a blanking time has elapsed. The function of the Vds detection block and the blanking time block may be combined in a single circuit. Alternatively, the function of the Vds detection block 3001, the blanking time block 3002, and a combinational logic function 3003 may be combined in a single circuit.

Figure 7:
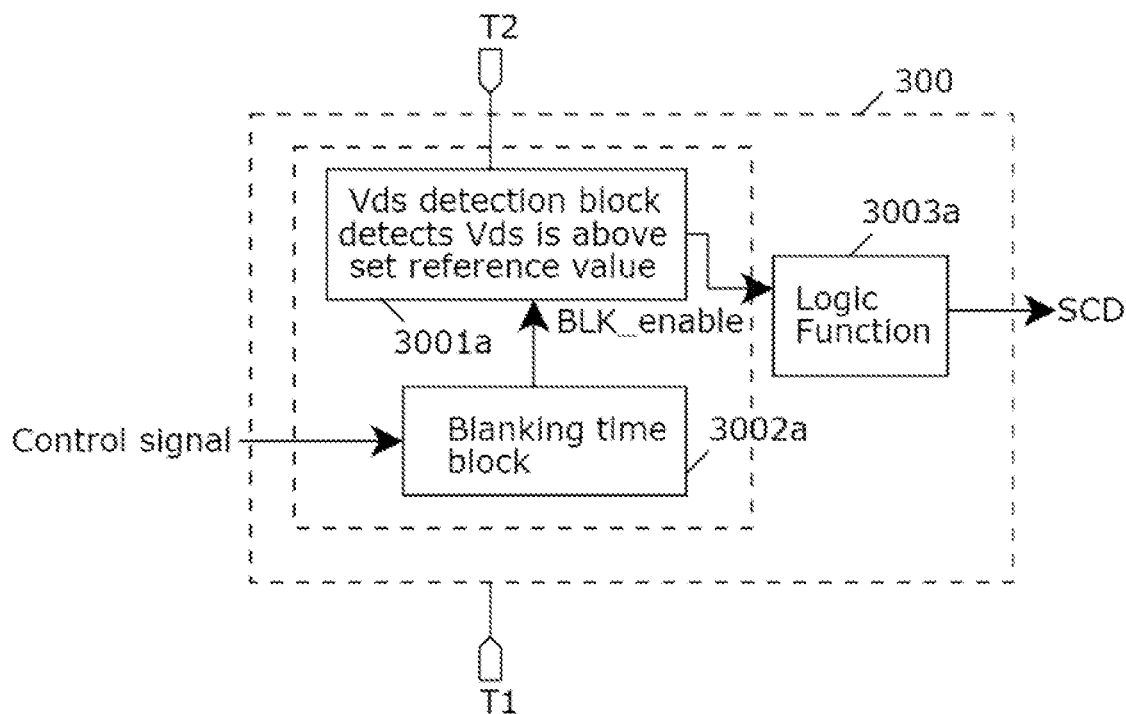
FIG. 7 illustrates a further example of the block diagram of a short-circuit detection circuit.

FIG. 7 illustrates an additional example of sub-blocks of the short circuit detection block 300. In this example, the blanking time block 3002a may act on the Vds detection block 3001a to enable its operation such that a high Vds signal may only be detected only when a blanking time has elapsed. The logic function block may be an optional block.

Figure 8:
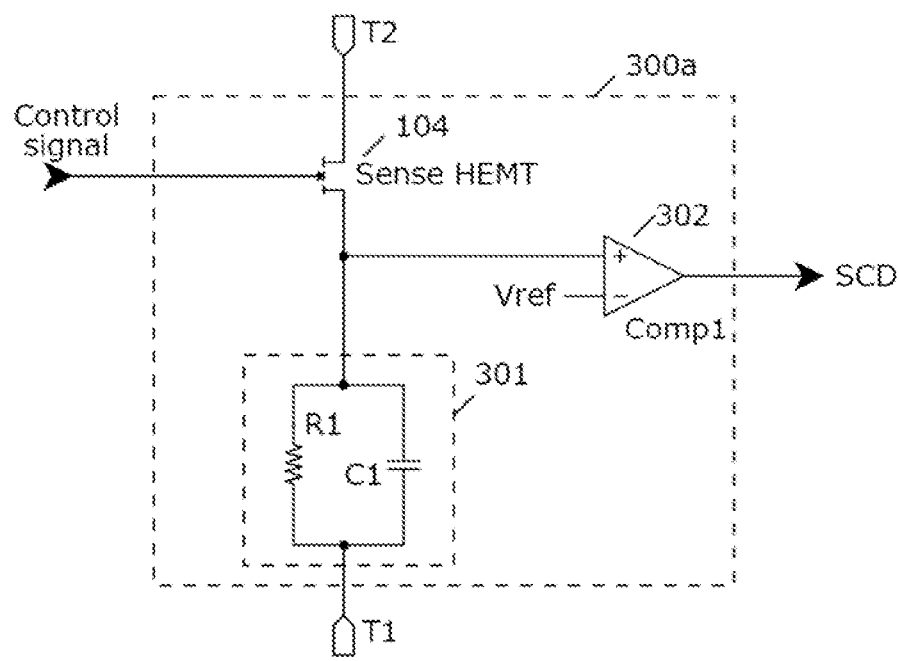
FIG. 8 illustrates an example of a short-circuit detection circuit.
Figure 9:
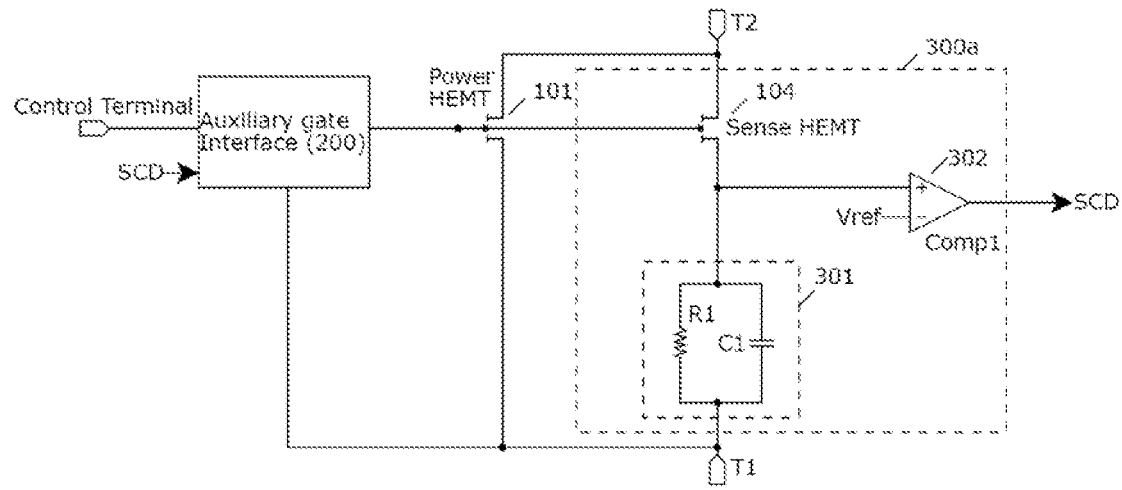
FIG. 9 illustrates an example in which a sense HEMT is driven by the signal driving the power HEMT.

FIG. 8 illustrates a schematic of one example of a short-circuit detection (SCD) circuit block 300. In this example the SCD block 300a comprises an additional HEMT functioning as a current sense transistor (Sense HEMT) 104, an RC network 301 and a comparator 302. The sense HEMT and Power HEMT may be identical in terms of structure but the main power HEMT having a much larger active area than the sense HEMT (e.g. by a factor of 10×, 100×, 1000×). The power HEMT and sense HEMT may have the drains connected together and the gates connected together but separate source terminals. The sense HEMT may be used to sense the current flowing through the source of the main power transistor to identify a short-circuit condition of the Power HEMT. The Sense HEMT may be driven by the control signal or may be driven by the signal which drives the power HEMT in the case where an auxiliary gate interface is used as illustrated in FIG. 9. When the control signal is high, i.e. indicating the power HEMT is in the ON-state, the sense HEMT is also ON and the capacitance in the RC network is charging through the Sense HEMT. The RC network can therefore set the blanking time, as a given amount of time is required to elapse with the control signal high for the capacitance to charge to a sufficient level. If a short circuit occurs the current through the sense HEMT will increase as V(T2)-V(T1) increases significantly. The sense HEMT will likely be in saturation hence the current through the device will be self-limited. With the RC network sufficiently charged during short circuit, the voltage at the source of the sense HEMT may exceed the reference value (Vref). The signal at the output of the comparator may change, for example from low-to-high in this condition. Therefore the circuit illustrated in FIG. 8 & FIG. 9 may comprise all the functions of the SCD block described in FIG. 6.

Figure 10:
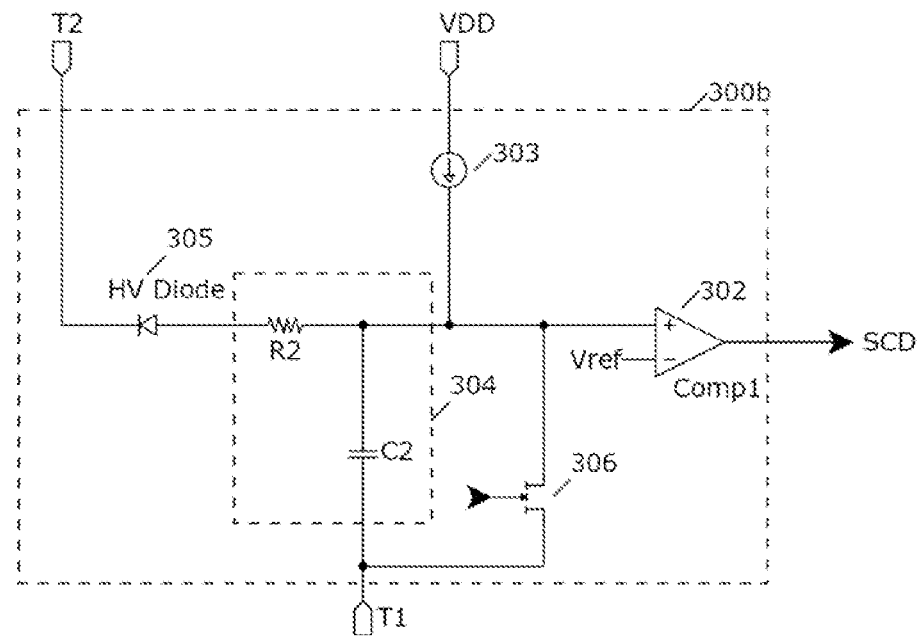
FIG. 10 illustrates another example of a short-circuit detection circuit.

FIG. 10 illustrates a schematic of an additional example of a short-circuit detection (SCD) circuit block 300. The circuit 300b in this example comprises a high voltage diode 305, an RC network 304, a current source 303 and a comparator 302. When V(T2)-V(T1) is low the HV diode is forward biased and therefore sinks the current from the current source. When V(T2)-V(T1) is high the HV diode is reverse biased and therefore the capacitance in the RC network can be charged to V(T2)-Vth, where Vth is the threshold voltage of the high voltage diode 305. When C is charged above Vref the comparator can change from low-to-high.

To prevent the RC network from being charged during the device off-state but rather only be charged during a short circuit condition, both a high V(T2)-V(T1) is required and the power HEMT to be in the ON-state. To add this functionality the transistor 306 may be included. The transistor 306 is driven by the control signal or a signal conditioned version of the control signal. Signal conditioned may mean for example the signal is level shifted and/or inverted.

Figure 11:
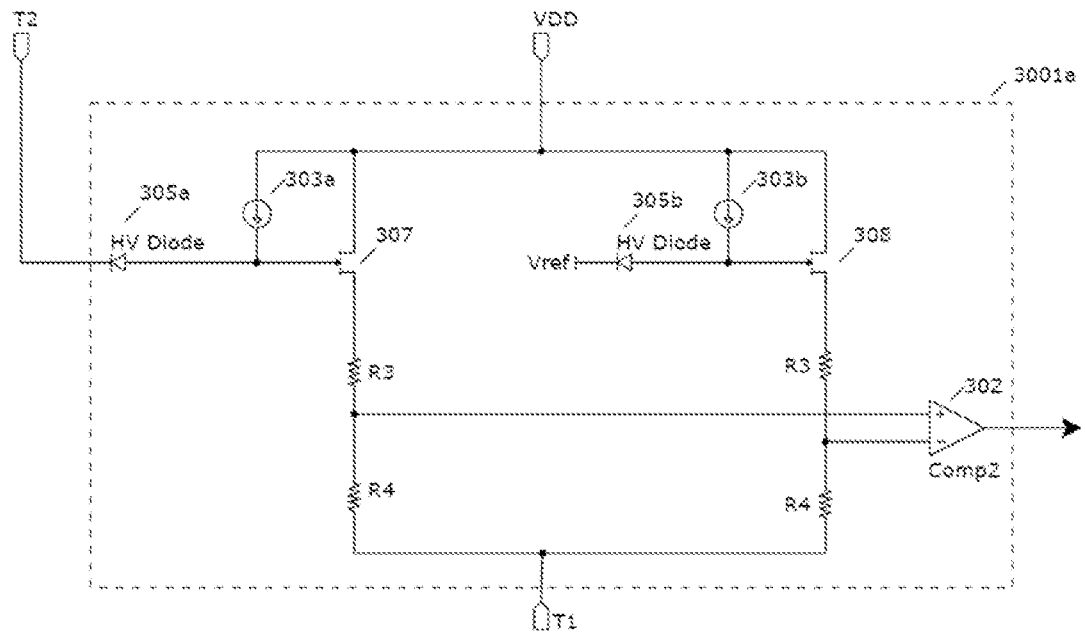
FIG. 11 illustrates an example of a VDS detection block.

FIG. 11 illustrates a schematic of an example of a VDS detection block 3001 from FIG. 6. This circuit 3001a is configured to have an output change if the drain to source voltage across the power HEMT (V(T2)-V(T1)) exceeds a set reference value. The detection block 3001a operates as a differential circuit to provide more accuracy across process and temperature variation. Each leg of the differential circuit comprises a HV diode, a current source and a current to voltage converter. A voltage from each leg of the differential circuit is configured as an input to a comparator. In this arrangement, the comparator changes output if V(T2)-V(T1) exceeds Vref.

Figure 12:
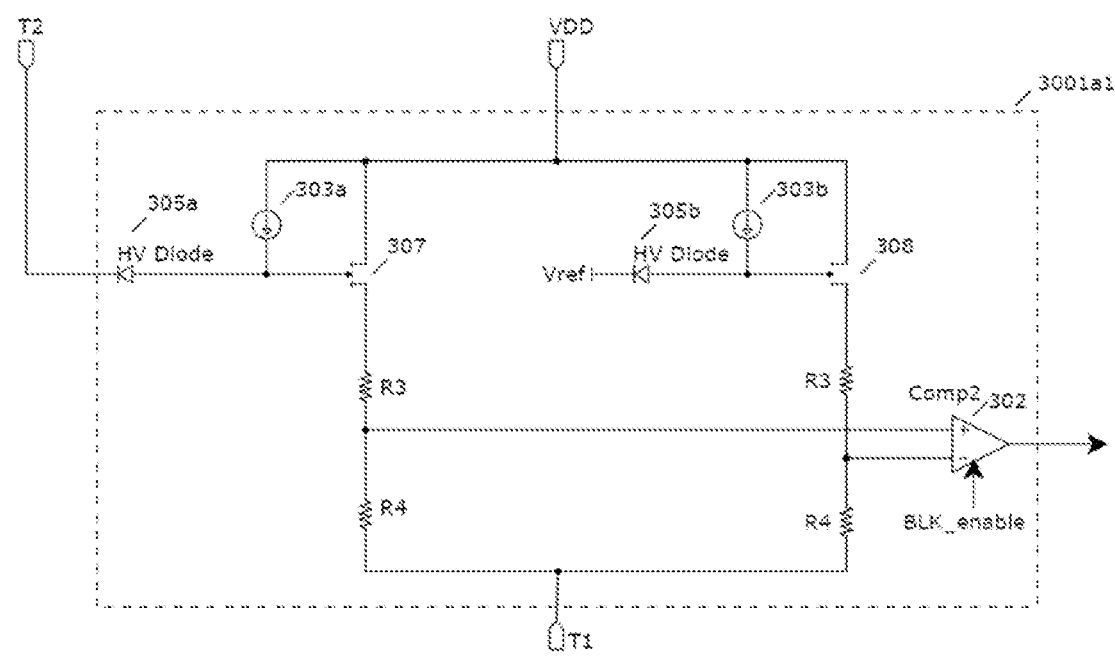
FIG. 12 illustrates another example of a VDS detection block.

FIG. 12 illustrates a schematic of an example of a VDS detection block 3001 from FIG. 7. This circuit 3001a1 is configured to have an output change if the drain to source voltage across the power HEMT (V(T2)-V(T1)) exceeds a set reference value. However, the comparator of this block is enabled by the output of the blanking time block, BLK_enable signal, which is output only when a set blanking time has elapsed. Therefore, the output of the VDS detection block changes only after the blanking time.

Figure 13:
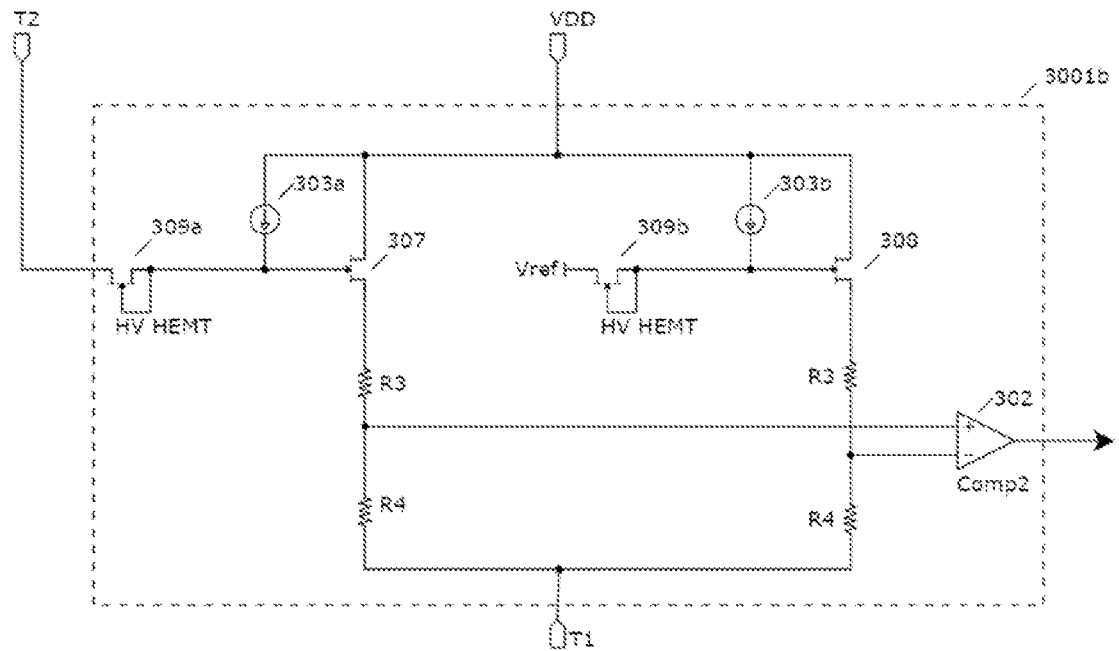
FIG. 13 illustrates a further example of a VDS detection block.

FIG. 13 illustrates an example of a VDS detection block similar to the embodiment in FIG. 11. In this embodiment, the HV diode is implemented using a source-gate connected high voltage HEMT.

Figure 14:
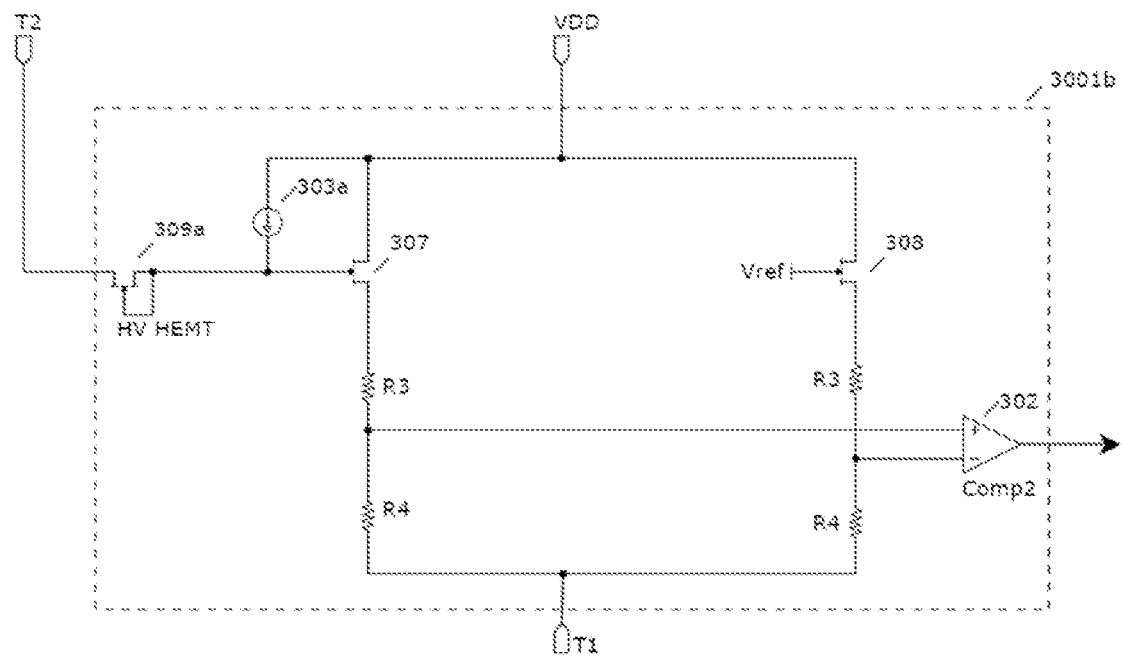
FIG. 14 illustrates another example of a VDS detection block.

FIG. 14 illustrates an example of a VDS detection block similar to the above embodiment where Vref is applied directly to the gate of transistor 308.

Figure 15:
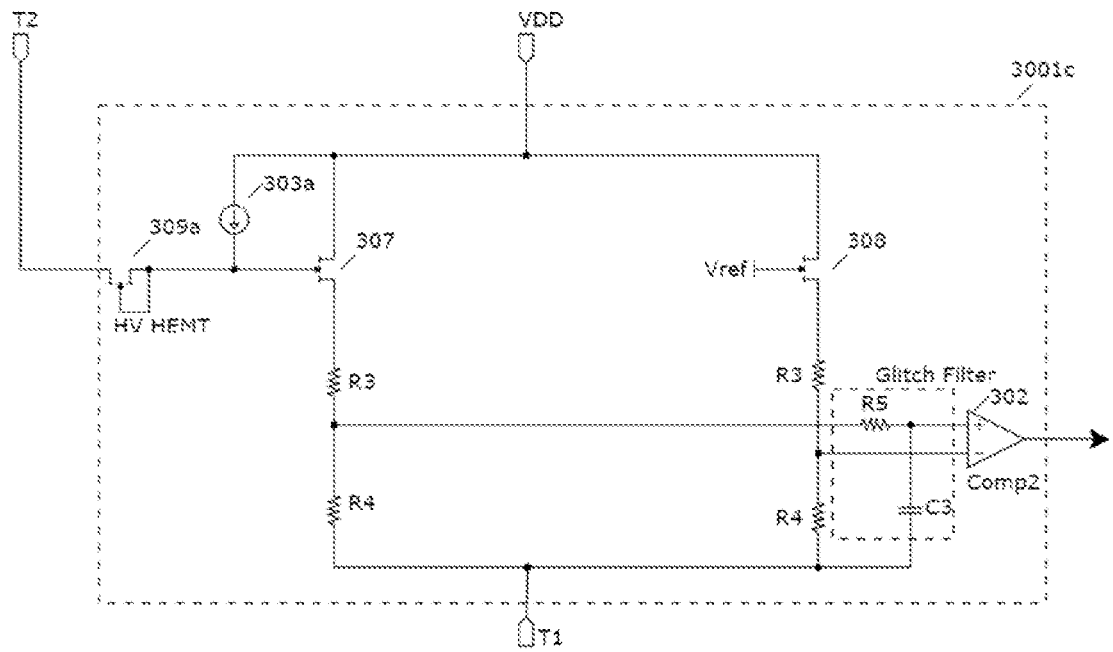
FIG. 15 illustrates an example of a VDS detection block with a glitch filter.

FIG. 15 illustrates an example of a VDS detection block similar to FIG. 14 with a glitch filter (low pass filter) at the input of the comparator. The filter is included to avoid the change in output of the comparator circuit due to noise or other high frequency signals in Vds. A similar glitch filter may be added to the other examples of VDS detection block included herein.

Figure 16:
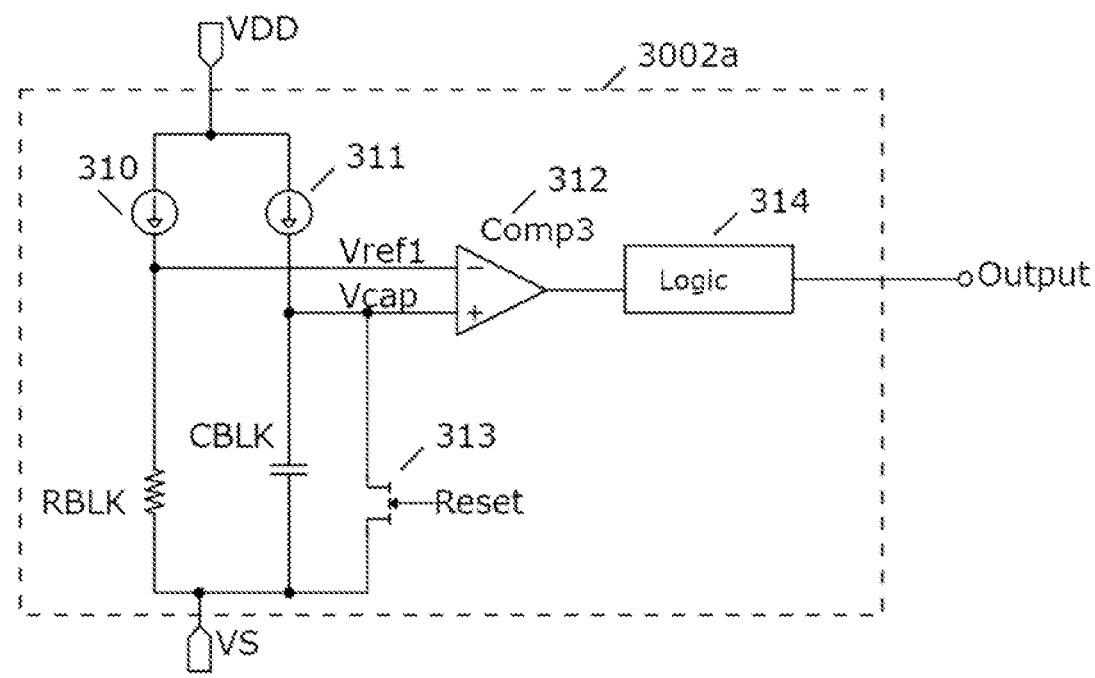
FIG. 16 illustrates an example of a blanking time block.

FIG. 16 illustrates an example of a Blanking time block 3002 as shown in FIG. 6. The blanking time block 3002a outputs a signal after a time has elapsed. The blanking time block 3002a comprises an RC blanking circuit connected to the voltage supply VDD through respective current sources. A low voltage transistor 313 is connected across the blanking capacitor CBLK. As an example, the transistor 313 may be a low voltage p-GaN gate HEMT. The blanking time block receives the control signal or alternatively a conditioned version of the control signal as an input from the control terminal of the power HEMT 101 as shown in FIG. 6. An inverted and preferably level-shifted version of the control signal may be connected as a 'reset' signal to the transistor 313. This signal conditioning of control signal may be performed within or outside the blanking time block and hence is not shown here for simplicity.

Figure 17:
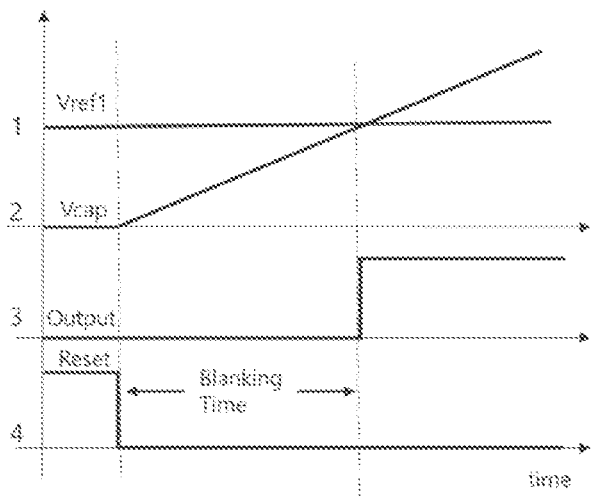
FIG. 17 illustrates the voltage values at the input of the comparator and the output of the blanking time block versus the reset input level.

FIG. 17 illustrates the voltage values at the input of the comparator Comp3 and the output of the blanking time block versus the reset input level. When the control signal is LOW (reset is HIGH), the transistor 313 turns ON pulling Vcap to ground and discharging the capacitor CBLK. When the control signal goes HIGH, the Reset input turns LOW. Transistor 313 turns-off thus allowing the charging of the capacitor CBLK by the current source through the voltage supply VDD. When Vcap (curve 2 in FIG. 17) exceeds Vref1 (curve 1 in FIG. 17), the output goes to HIGH. To summarize, the output of the circuit in FIG. 16 does not change from low-to-high until a given time has passed after the control signal has changed from low-to-high. This time can be defined as the blanking time. The blanking time can be reduced or extended based on the choice of current source value and/or capacitor value. The blanking time defined by the circuit may vary according to process variations in the value of the components mentioned.

As described, the blanking time is used to define a time for which the SCD circuit cannot detect a short circuit event at the start of an ON-pulse of the power HEMT to avoid false triggering the short circuit protection circuit during normal device switching. It may therefore be desirable for the blanking time process variation to be matched to the process variation of the switching time of the power HEMT. For example, a longer blanking time may be desirable if used in a circuit with a power HEMT that takes longer to complete a switching event (and vice versa). A circuit which can achieve better process matching between a power HEMT and a blanking time circuit is illustrated in FIG. 18.

Figure 18:
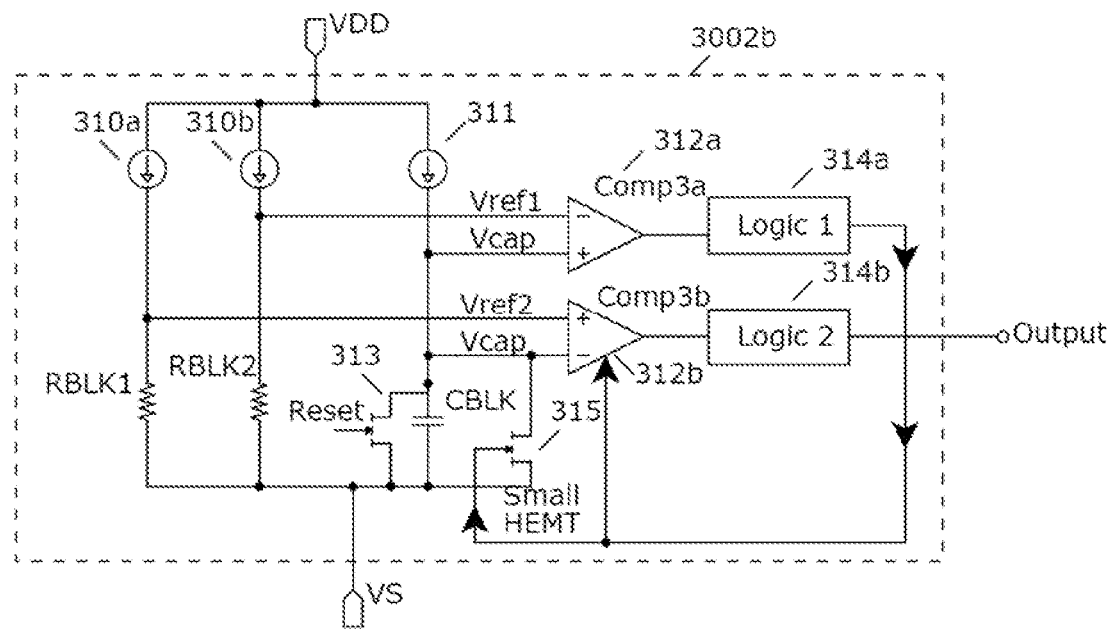
FIG. 18 illustrates another example of a blanking time block.

FIG. 18 illustrates another example of the Blanking time block 3002 as shown in FIG. 6. In this example, the blanking time block 3002b is designed to consider the process variations of the power HEMT and configured to calculate overall blanking time based on power HEMT Rdson. To accomplish this a small HEMT 315 that is same as the power HEMT is provided across the capacitor CBLK, therefore, discharge rate of CBLK depends on the small HEMT's Rdson, and thus indirectly on the power HEMT Rdson as the small HEMT and the power HEMT may be expected to vary in the same manner if process variation is present. The small HEMT 315 and Power HEMT may be identical in terms of structure but the main power HEMT having a much larger active area than the small HEMT (e.g. by a factor of 10×, 100×, 1000×). Output of logic 1 depends on RBLK2 and CBLK. The output of logic 1 drives the small HEMT 315 and also acts as an enable signal for the comparator Comp3b. Thus the output of logic 2, which is also the output of the overall blanking time block 3002b, depends on RBLK1, small power HEMT 315 and CBLK as well as the output of logic 1.

Figure 19:
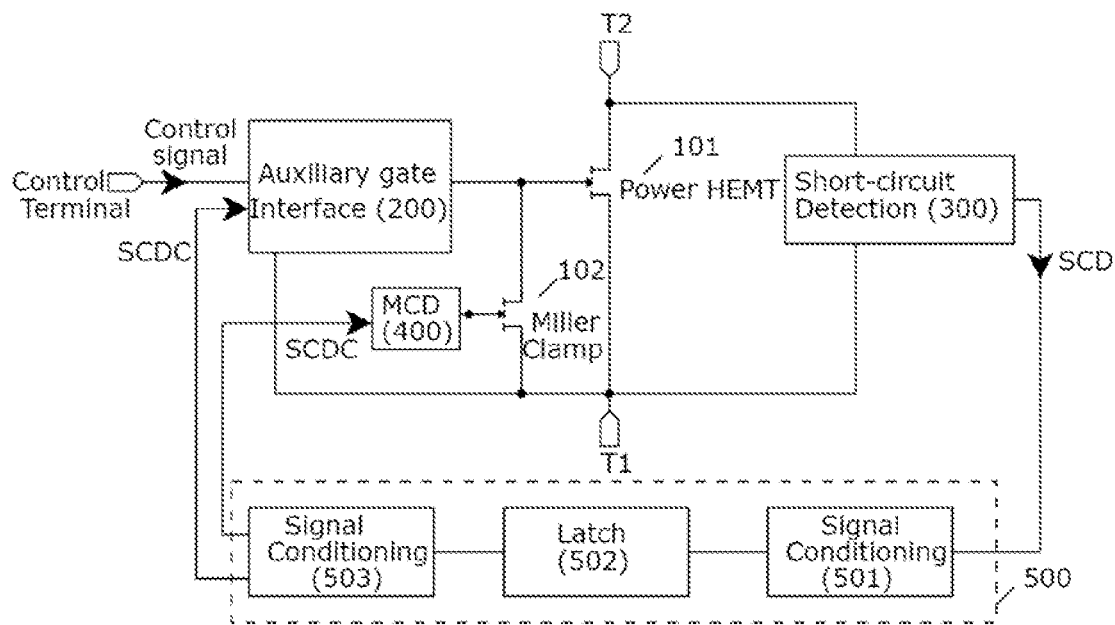
FIG. 19 illustrates an example of a circuit which may be connected between the output of the SCD block and the auxiliary gate interface and Miller clamp/Miller clamp drive circuit.

FIG. 19 illustrates an example of a circuit 500 which may be connected between the output of the SCD block 300 and the auxiliary gate interface and Miller clamp/Miller clamp drive circuit. The output of the SCD block may indicate whether a short circuit event is occurring in the power HEMT 101 but may require some signal conditioning to be suitable for use as an input to the auxiliary gate interface and Miller clamp which can act to protect the power HEMT. Signal conditioning blocks 501 and 503 may refer to circuits which cover functions such as level shifting, buffer, filter, or some combination logic with other sensing signals in the power IC. Additionally, a latch circuit block 502 may be required. The function of the latch circuit block 502 is to hold a signal which indicates that the power HEMT is in a short circuit event in a set state until another condition is met. This is to avoid oscillations of short circuit event detection and protection circuits. The additional condition may be time-dependent or signal dependent or both. An example of a time dependent condition may be that sufficient time has elapsed since a short circuit event occurred for the device to sufficiently dissipate the heat generated during the short circuit event. An example of a signal dependent condition is a HIGH-to-LOW control signal pulse being received from the power HEMT gate driver. In one example, a logic function of two conditions may be required for the latch to be released, for example both elapsed time and a HIGH-to-LOW pulse from the gate driver. It may be noted that above embodiment is only an example of the circuit 500 and it may contain any combination of the blocks 501, 502 and/or 503 as all of these are optional.

Figure 20:
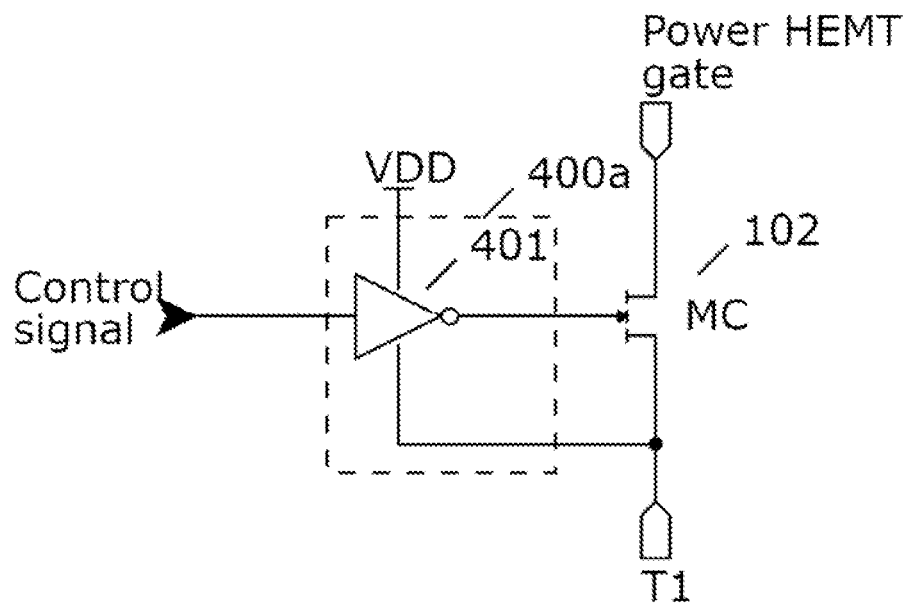
FIG. 20 illustrates an example of a Miller Clamp Drive (MCD) block.
Figure 21:
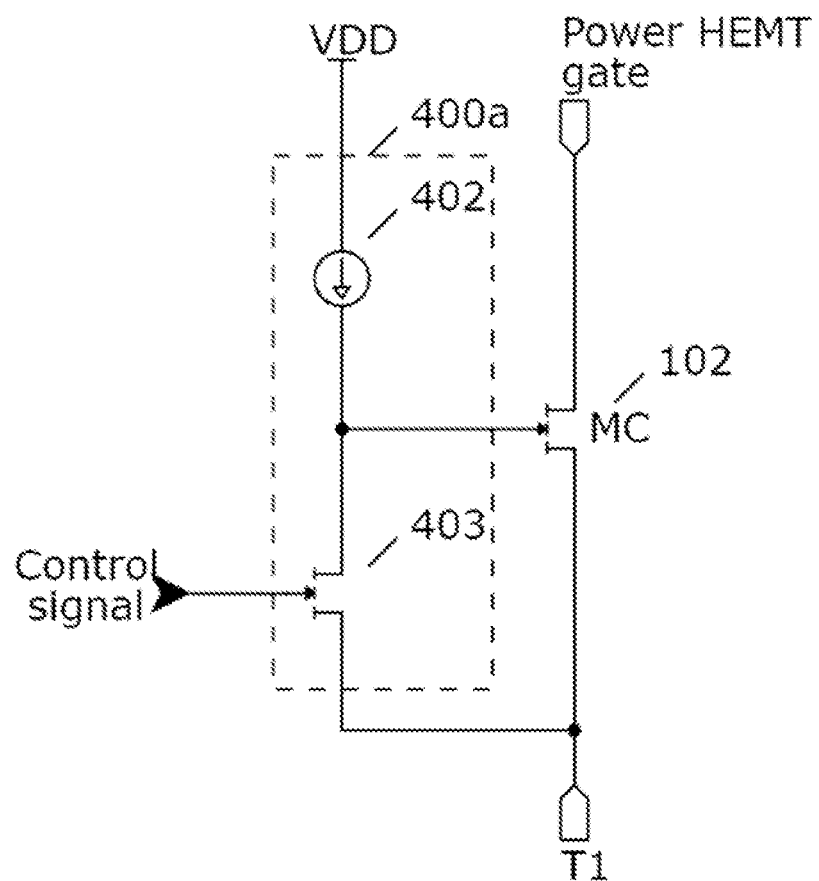
FIG. 21 shows an example of an implementation of a logic inverter.

FIG. 20 illustrates an example of the Miller Clamp Drive (MCD) block 400 that is part of the power integrated circuit shown in FIG. 3 and FIG. 4. The Miller clamp driver 400*a* consists of a logic inverter 401 configured to operate the actively switched Miller clamp transistor 102 which acts as the pull-down network. The logic inverter 401 could be composed of a resistor or resistive element (i.e. load transistor or a current source) and an enhancement mode transistor. FIG. 21 shows an example of the implementation of the logic inverter 401 in the block 400*a*. However, this is merely provided as an example configuration, and other logic inverter designs could be utilised in place of or in addition to this.

In operation, the logic inverter is operatively connected to the control signal from the control terminal or the external gate terminal (i.e. the terminal connected to the gate driver). When the control signal is high, the bias on the gate of the actively switched transistor in the Miller clamp 102 is low (therefore its resistance is high) and vice versa.

Figure 22:
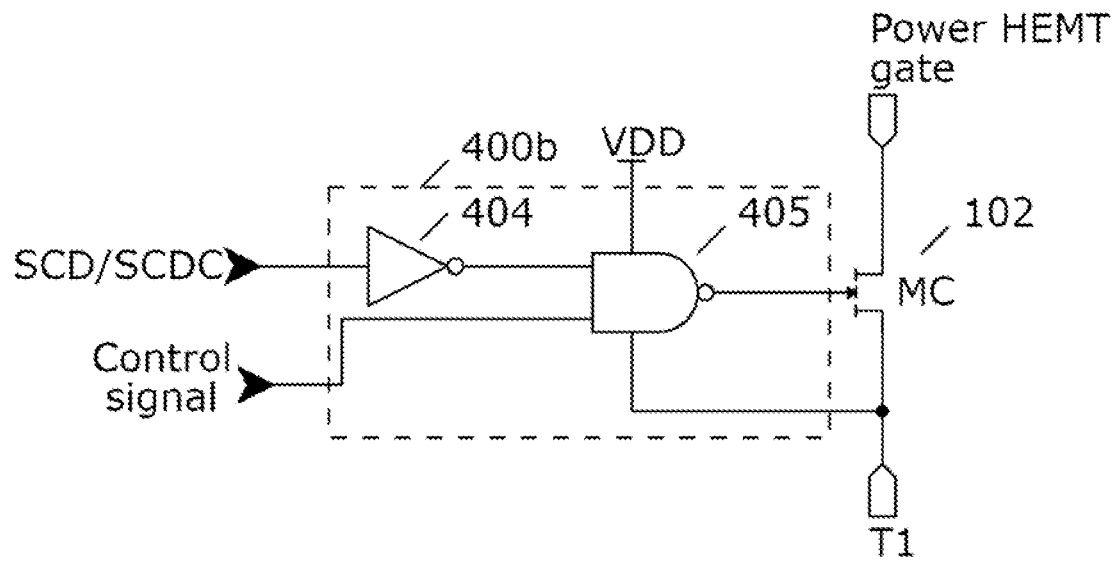
FIG. 22 illustrates an example implementation of the Miller Clamp Drive (MCD) block when it operates based on short-circuit detection signal (SCD)

FIG. 22 illustrates an example implementation of the Miller Clamp Drive (MCD) block 400 when it operates based on short-circuit detection signal (SCD). The Miller clamp driver 400*b* consists of a logic inverter 404 and a logic gate (NAND gate) 405. In this scenario, the Miller Clamp driver 400*b* has two input signals-control signal and short-circuit detection signal SCD or conditioned version of SCD (SCDC) based on FIG. 19. When the SCD/SCDC signal is HIGH or the control signal is LOW the drive block 400*b* will output a HIGH signal activating the Miller clamp transistor 102 which would act to pull-down the gate of the power HEMT 101.

Figure 23:
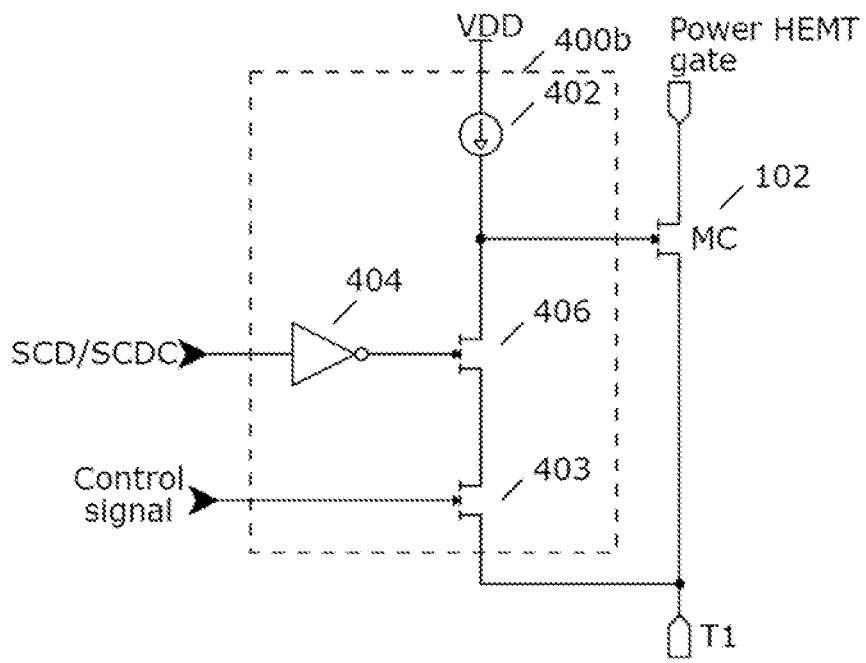
FIG. 23 illustrates a further example of a MCD block.

FIG. 23 shows an example of the implementation of Miller clamp drive block 400*b* from FIG. 22. However, this is merely provided as an example configuration, and other circuit designs could be utilized in place of or in addition to this.

Figure 24:
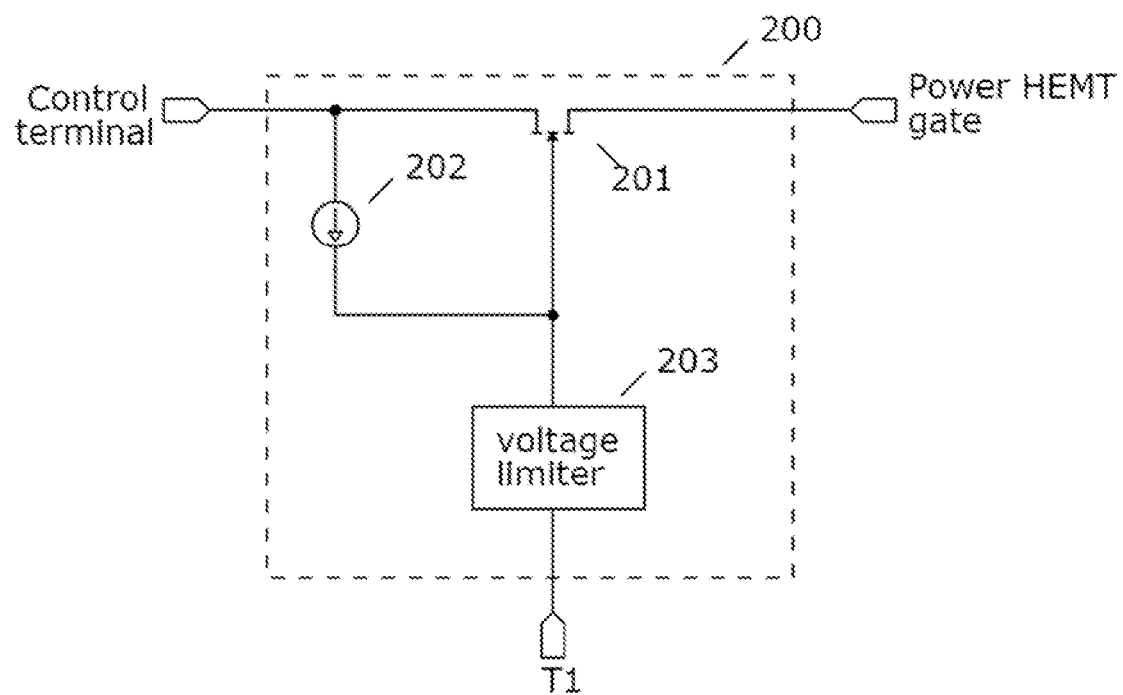
FIG. 24 illustrates an example of the auxiliary gate interface block that is part of the circuit shown in FIG. 2, FIG. 3, FIG. 4, and FIG. 5.

FIG. 24 illustrates an example of the auxiliary gate interface block 200 that is part of the power integrated circuit shown in FIG. 2, FIG. 3, FIG. 4, and FIG. 5. The integrated auxiliary gate interface block (200) is composed of an auxiliary GaN HEMT 201, which could be preferably a low-voltage device, wherein the high-voltage power HEMT has the gate connected to the source of the integrated auxiliary GaN HEMT and the auxiliary GaN HEMT has the drain connected to the power integrated circuit (power IC) control terminal. The auxiliary GaN HEMT is configured to adapt the driving voltage of the control terminal to that suitable and allowable for the GaN HEMT.

A current control block 202 is connected between the drain and gate terminal of the auxiliary GaN HEMT 201. The current control block has one connection to the control terminal. The current control block may be a resistive element or incorporate a resistive element. Alternatively, the current control circuit may be or comprise a current source as shown here for example. However, this is merely shown as an example configuration, and other circuit designs could be utilized in place of or in addition to the current source.

An integrated voltage limiting block 203 is connected between the gate terminal of the auxiliary HEMT and the low voltage terminal of the power integrated circuit. The voltage drop across the auxiliary gate interface block 200 is non-linear when the voltage signal on the control terminal increases linearly. The low gate leakage current for the high voltage power HEMT is achieved by limiting the potential on the power HEMT gate (active gate) terminal. This is achieved by allowing for a voltage drop across the integrated auxiliary gate interface block. The limit on the potential of the power HEMT gate terminal is defined by designing the current control block and voltage limiting circuit block appropriately such that the gate of the auxiliary GaN HEMT is pulled down when the gate signal on the control terminal of the power IC increases beyond a certain level. The gate voltage operation window of the power IC (i.e. the voltage operation window applied to the control terminal) is therefore increased compared to that of a conventional GaN HEMT.

Since the auxiliary GaN HEMT would preferably be a low voltage device, its source and drain terminal could be interchanged as they are commonly made in a symmetrical (or similar) way. By a low-voltage device, we mean a device that can typically have a rated breakdown below 20V and limited current capability (under 100 mA). However, it should be understood that the auxiliary gate could also be a high power or high voltage device, although this may add cost and complexity.

Figure 25:
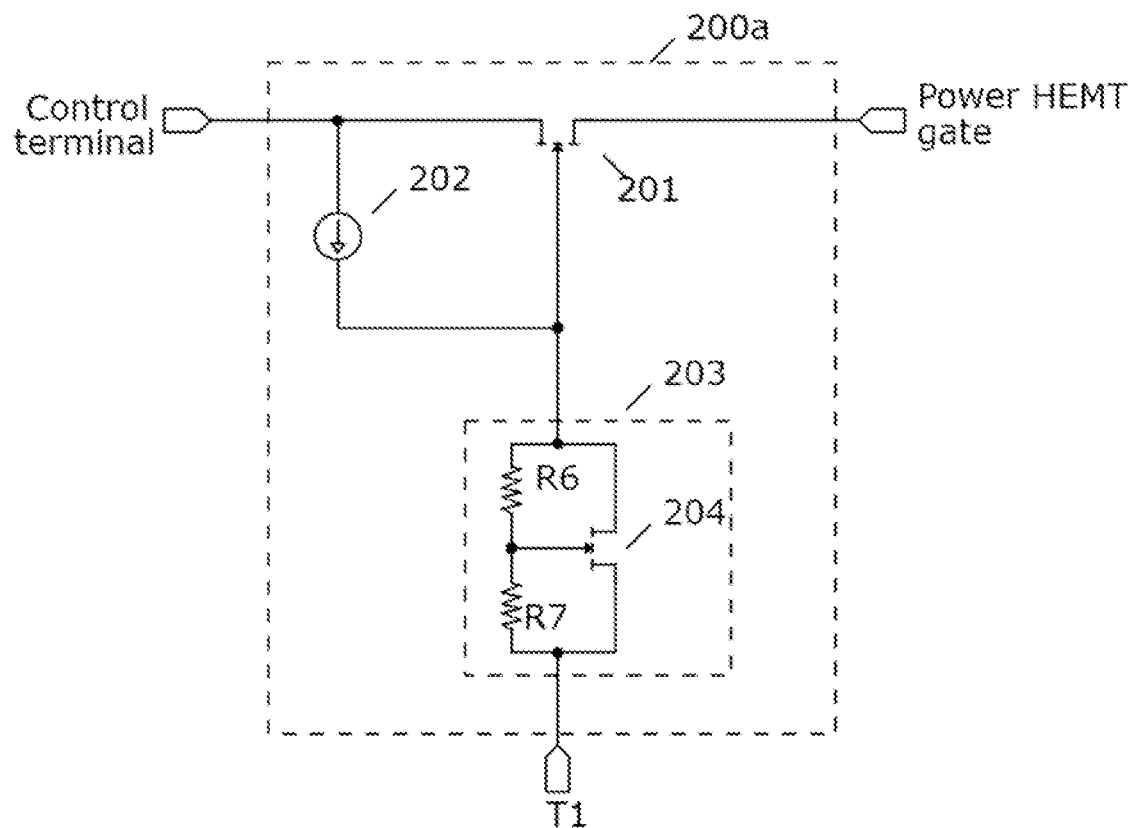
FIG. 25 illustrates another implementation of the auxiliary gate interface block with an example configuration of the voltage limiter with a pull-down HEMT in threshold multiplier configuration.

FIG. 25 illustrates another implementation of the auxiliary gate interface block 200 with an example configuration of the voltage limiter 203 with a pull-down HEMT 204 in threshold multiplier configuration. The threshold multiplier configuration in this embodiment comprises a potential divider (R6 and R7) and a pull-down enhancement mode HEMT 204 where the midpoint of the potential divider is connected to the gate terminal of the pull-down HEMT 204. In this embodiment, the top of the potential divider is connected to the drain of the pull-down enhancement mode HEMT 204 and the gate terminal of the auxiliary GaN HEMT 201. The gate potential of the HEMT 204 is controlled to set the voltage drop across the pull-down HEMT 204 which can be controlled by the choice of resistors in the potential divider described. This limits the gate voltage of the auxiliary GaN HEMT 201 and the voltage drop across the auxiliary gate block. This function can protect the power HEMT gate terminal from over-voltage events.

Figure 26:
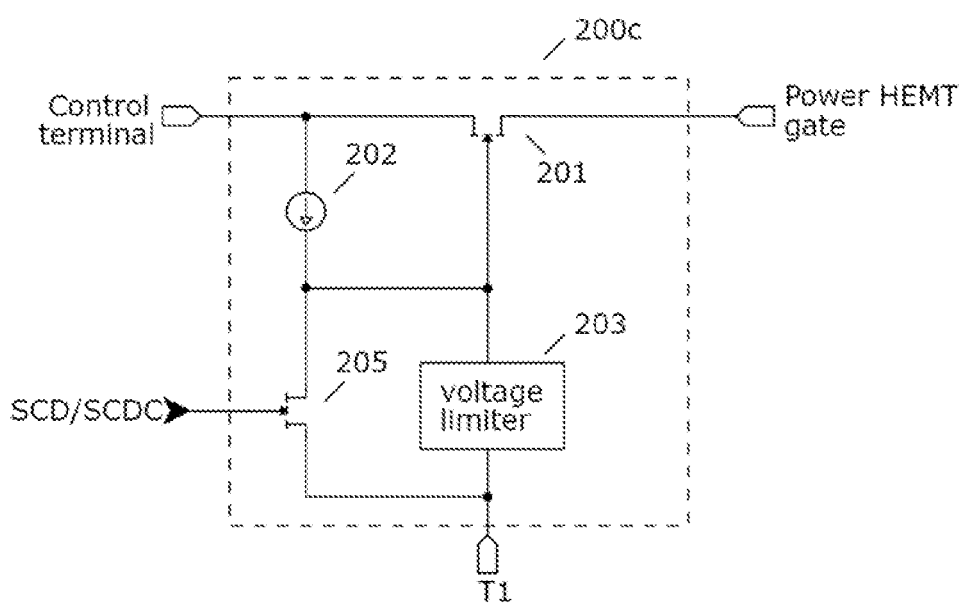
FIG. 26 illustrates an example implementation of the auxiliary gate interface block when it operates based on short-circuit detection signal (SCD)

FIG. 26 illustrates an example implementation of the auxiliary gate interface block 200 when it operates based on short-circuit detection signal (SCD). The auxiliary gate interface block 200*c* includes an additional HEMT 205 connected in parallel to the voltage limiter of the circuit shown in FIG. 24. The gate of the additional HEMT 205 is connected to the short-circuit detection signal SCD or conditioned version of SCD (SCDC). When a short-circuit is detected and the SCD/SCDC signal is HIGH, the HEMT 205 is turned ON, pulling-down the gate of the auxiliary GaN HEMT 201 to ground. This turns-off the auxiliary GaN HEMT and therefore the power HEMT gate and the control terminal become effectively electrically disconnected. In this condition, if the bias of the power HEMT gate is lowered or grounded, then a high signal from the control terminal no longer can lead to a high signal of the power HEMT gate.

Figure 27:
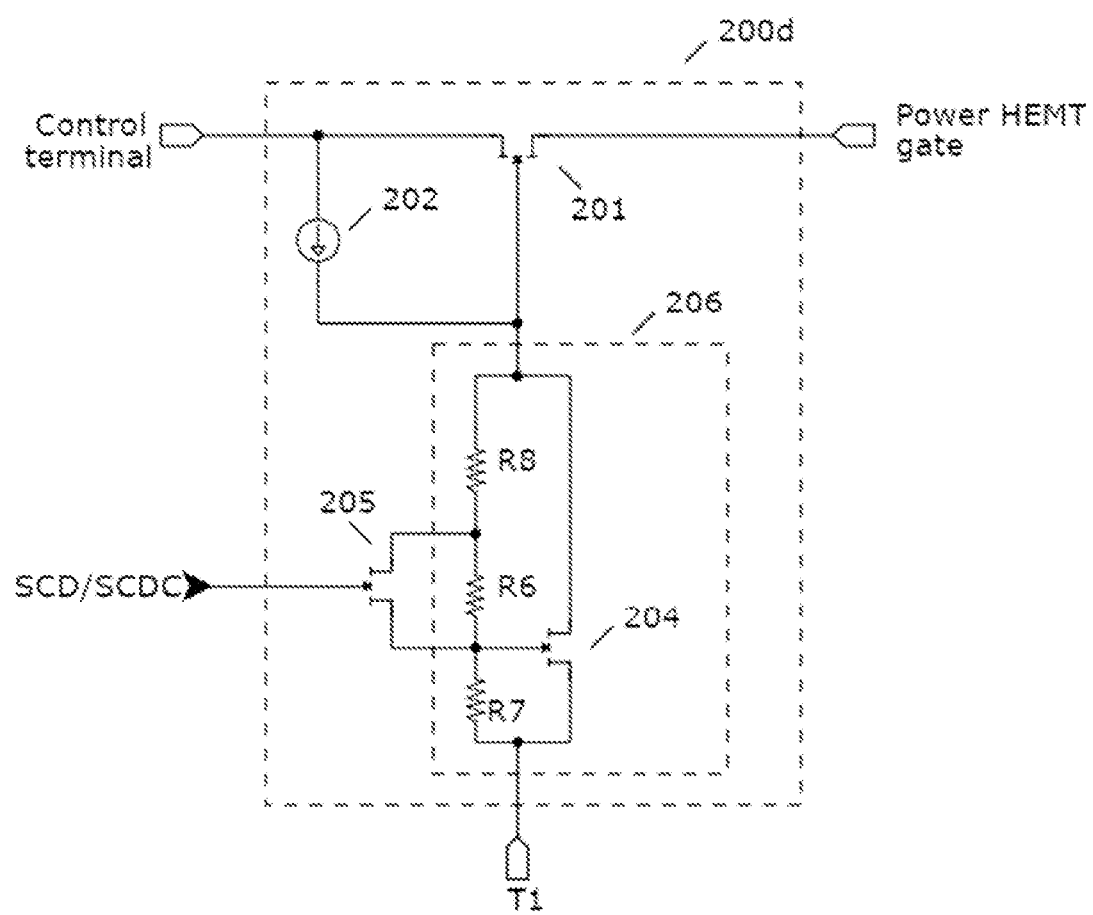
FIGS. 27-30 illustrate further examples of how the auxiliary gate interface block provides protection during a short-circuit condition.

FIG. 27 illustrates another example of how the auxiliary gate interface block provides protection during a short-circuit condition. In this example, the voltage limiter circuit 206 includes an additional resistor R8 added in series to the potential divider R6/R7. The additional HEMT 205 is connected in parallel to the resistor R6 such that when SCD/SCDC is HIGH (short-circuit condition), the ratio of the resistance in the potential divider is changed shorting the resistor R6. The changed resistance ratio helps in changing the regulated voltage applied at the gate of the auxiliary GaN HEMT. A reduced regulated voltage on the gate of the power HEMT is beneficial in a short circuit condition as it reduces the power HEMT saturation current and enables the power HEMT to survive the short circuit condition for longer before failure.

Figure 28:
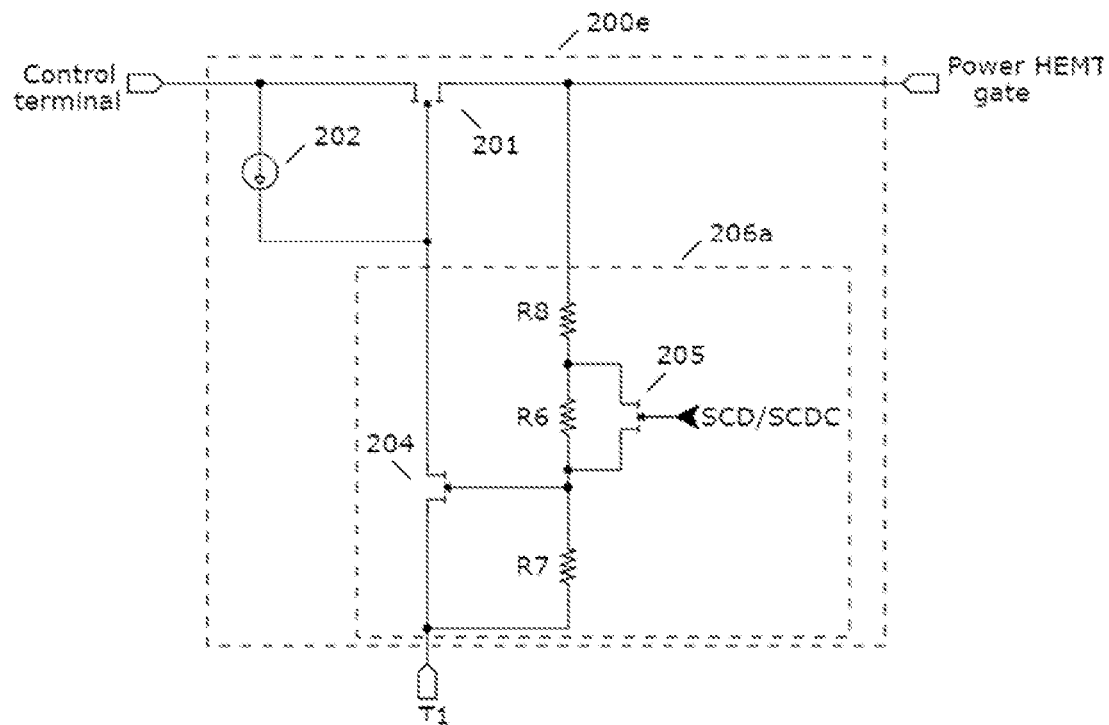

FIG. 28 illustrates another example implementation of how the auxiliary gate interface block provides protection during a short-circuit condition. Here, the potential divider is connected between the gate of the power HEMT 101 and the low voltage terminal of the power IC. Therefore, when the SCD/SCDC signal is HIGH, the resistance ratio of the potential divider is changed which changes the regulated gate voltage of the auxiliary GaN HEMT.

Figure 29:
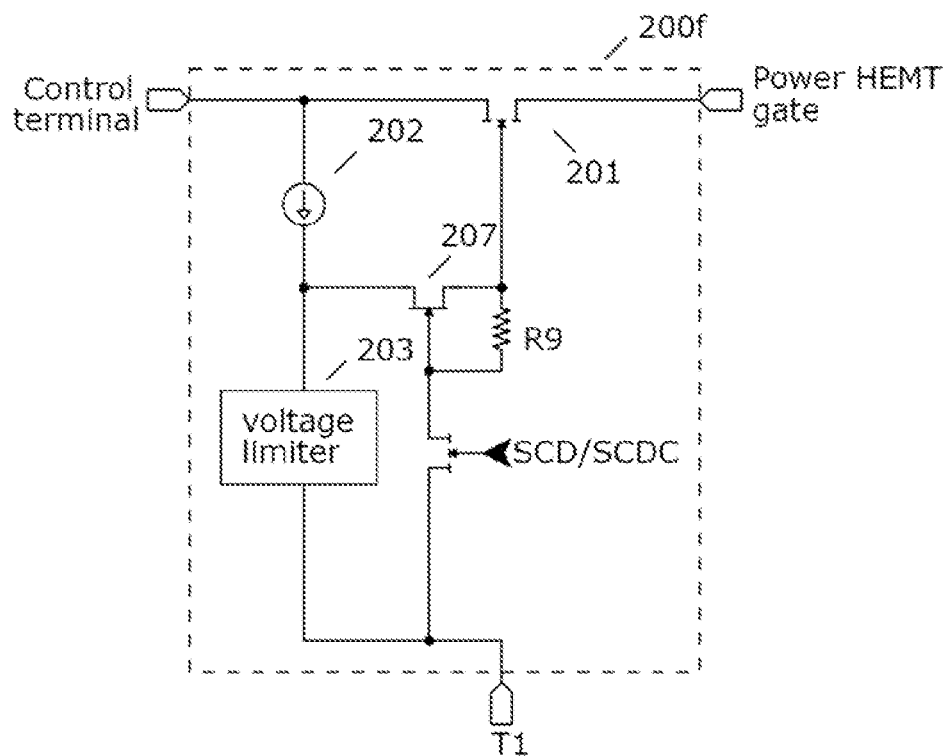

FIG. 29 illustrates another example implementation of how the auxiliary gate interface block provides protection during a short-circuit condition. This example operates in a similar manner to the example in FIG. 26, but comprises an additional transistor 207 and a resistor R9. These components are included to limit the potential across the current source 202 when transistor 205 is turned ON when a short circuit event occurs.

Figure 30:
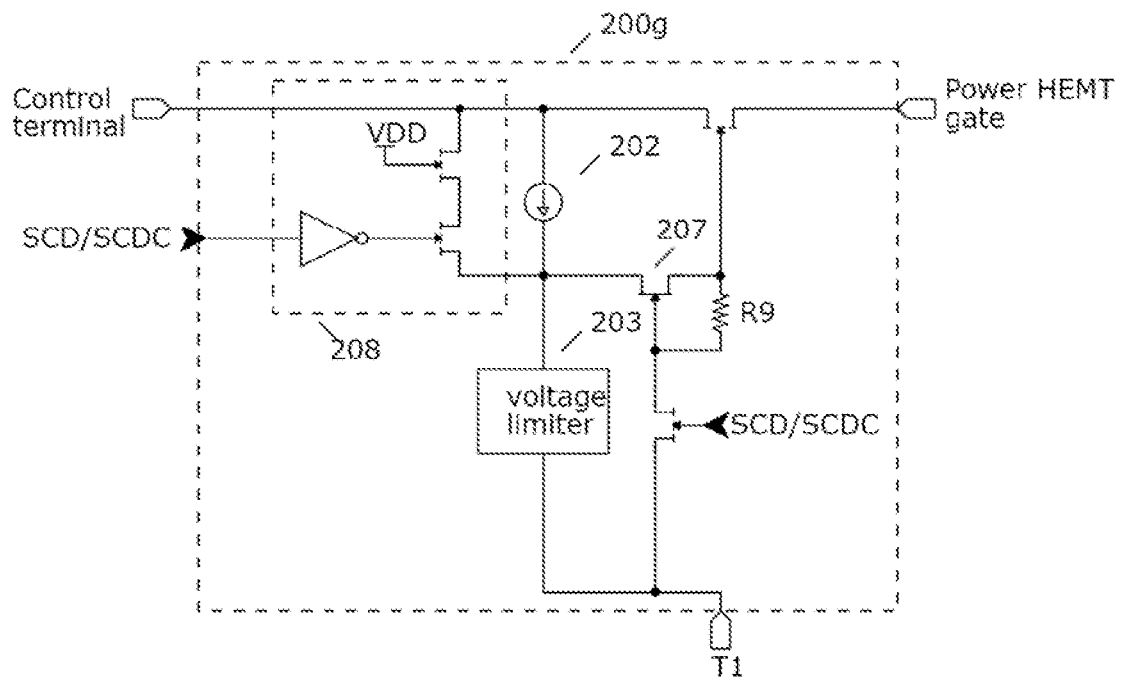

FIG. 30 illustrates another example implementation of how the auxiliary gate interface block provides protection during a short-circuit condition. This example operates in a similar manner to the example in FIG. 29, but comprises additional circuit 208. In general, a trade-off exists between the bandwidth and power consumption of examples of the auxiliary gate interface presented herein. In this example, through the inclusion of circuit 208, the power dissipation of the auxiliary gate interface can be higher in regular operation and then be reduced during the occurrence of a short circuit event.

Figure 31:
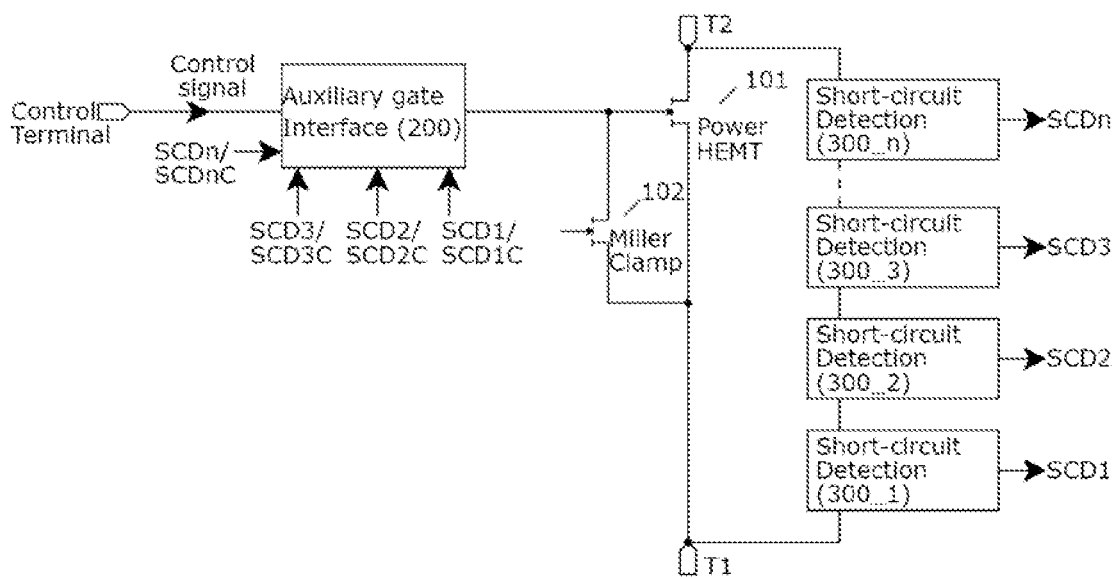
FIG. 31 illustrates a short-circuit detection and protection mechanism.

FIG. 31 illustrates another aspect of the present disclosure. The short-circuit detection and protection may be performed through a series of detection and protection phases rather than a single short-circuit detection step. More than one short-circuit detection circuits may be connected between the drain and source of the power HEMT, each having a different voltage reference for the Vds detection block and a different blanking time generating a series of SCD signals. These signals may act on the auxiliary gate interface to regulate the gate voltage of the power HEMT or on the Miller clamp to pull down the gate of the power HEMT. The benefit of having multiple signals is that the signal coming from the detection block with lower reference voltage may regulate the gate voltage by a lesser extent than the signal coming from the detection block with higher reference voltage. As the blanking times would be different for all the SCD blocks, these signals would not all turn HIGH at the same time. Thus, this provides a mechanism of gradual regulation of the operation of the power device and avoid a sudden and complete turn-off of the device at the inception of the short-circuit event. If the short-circuit event persists for a longer time and beyond a certain limit the gate of the power HEMT can be completely pulled down thus turning the power HEMT completely off rather than simply adjusting its saturation current during the short circuit condition. The SCD blocks 300_1 to 300_$n$ may be implemented based on any of the previous embodiments.

Figure 32:
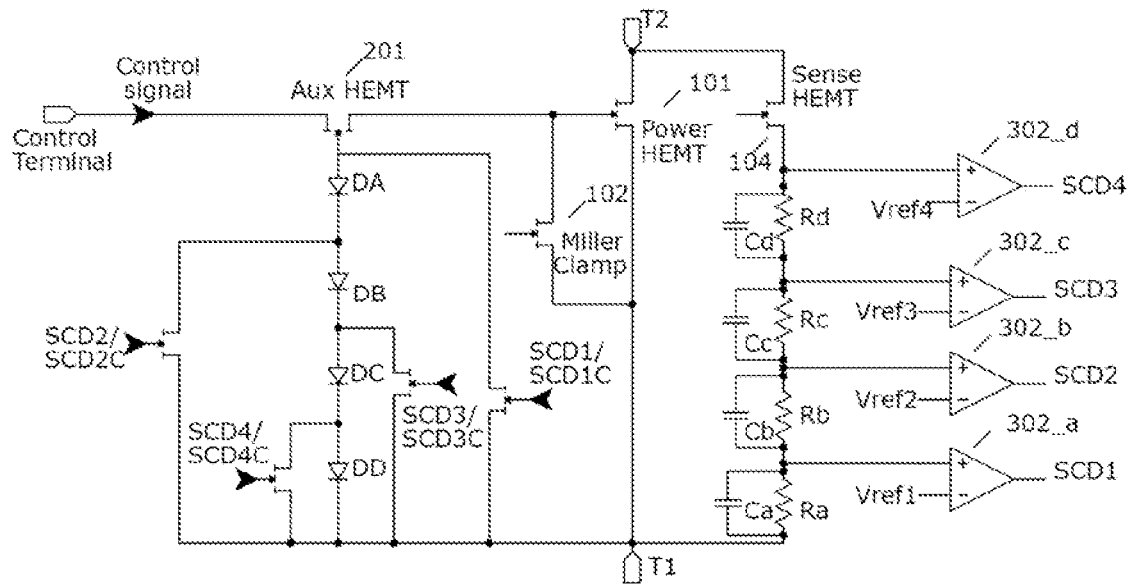
FIG. 32 illustrates an example implementation of the short-circuit detection and protection mechanism illustrated in FIG. 31.

FIG. 32 illustrates an example implementation of the short-circuit detection and protection mechanism explained in FIG. 31. This implementation follows the detection mechanism illustrated in FIG. 8. Here, the sense HEMT may be provided with a series of RC networks with each having an output signal that may be compared with a respective reference value to output a series of short-circuit detection signal. As an example, four RC networks are shown in FIG. 32 that generate SCD signals 1 to 4. However, it should be understood that there may be less or a greater number of RC networks. Based on the values of the RC networks and the reference voltage levels, the SCD signals would transition to HIGH values as the short-circuit condition may grow and increase the drain to source voltage of the power HEMT. These signals or their respective conditioned versions (SCDC) may act on the voltage limiter (which in this example comprises several diodes connected in series) at various levels to regulate the gate voltage of the power HEMT in a gradual manner reducing the gate voltage by a greater value with each SCD signal turning HIGH. Therefore, the gate voltage of the power HEMT would in turn be gradually controlled to reduce the operation of the power HEMT rather than completely turning it OFF. The schematic does not show the application of the SCD signals to the Miller clamp drive only for simplicity. Any one or more of the SCD/SCDC signals may be applied to the Miller clamp drive based on the level of SCD when the Miller clamp should be turned-on to pull-down the gate of the power HEMT to the lower voltage level of T1.

Figure 33:
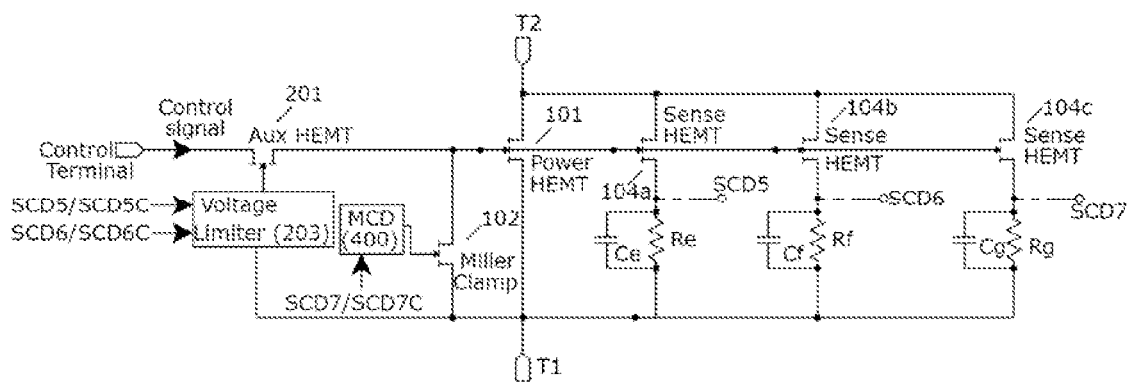
FIG. 33 illustrates another example of gradual regulation of the power HEMT in a short-circuit condition.

FIG. 33 illustrates another example of gradual regulation of the power HEMT in a short-circuit condition. In this example, instead of series combination of resistors with one sense HEMT, multiple sense HEMTs are connected in parallel with RC networks connected as sensing load for each sense HEMT. Three sense HEMTs are shown as an example, however it should be understood that less or a greater number of sense HEMTs may be connected in same way. The dotted lines connecting the RC network to the SCD signal are shown as a placeholder for the respective comparators that are not shown only for simplicity. In this configuration, based on the respective reference values, first few SCD signals such as SC5 and SCD6 would provide an initial indication of the presence of a short-circuit and hence, these signals or their conditioned versions may be applied to the voltage limiter of the auxiliary HEMT to regulate the operation of the power HEMT during the initial stage. If even after the regulation, the signal compared against a higher reference value (for example SCD7) may still be HIGH to indicate short-circuit, then this signal may be provided as an input to the Miller Clamp drive to turn off the power HEMT completely.

Figure 34:
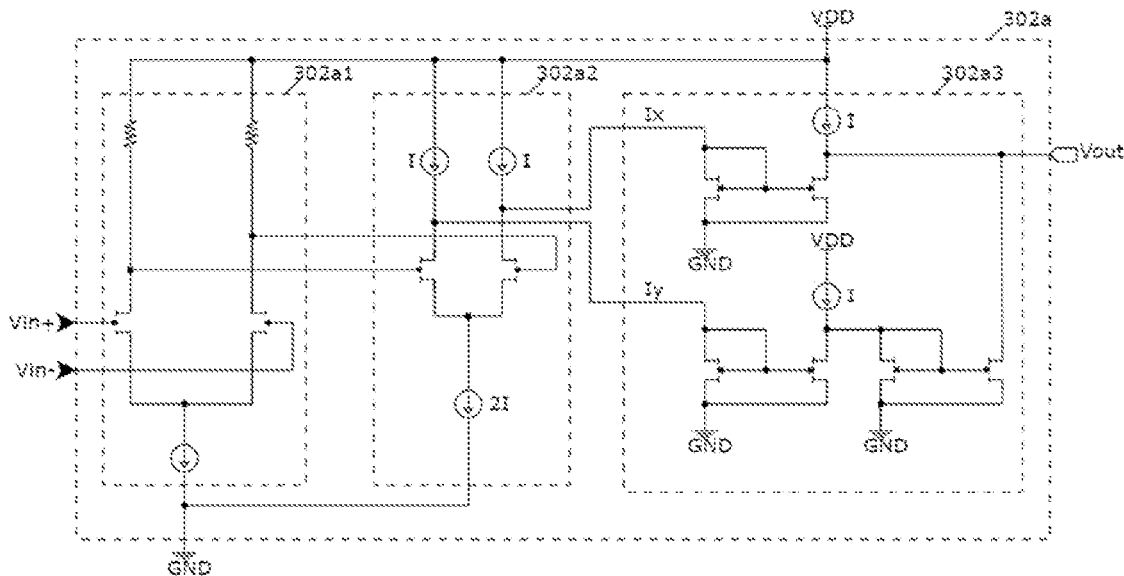
FIG. 34 and FIG. 35 illustrate two examples of comparators.
Figure 35:
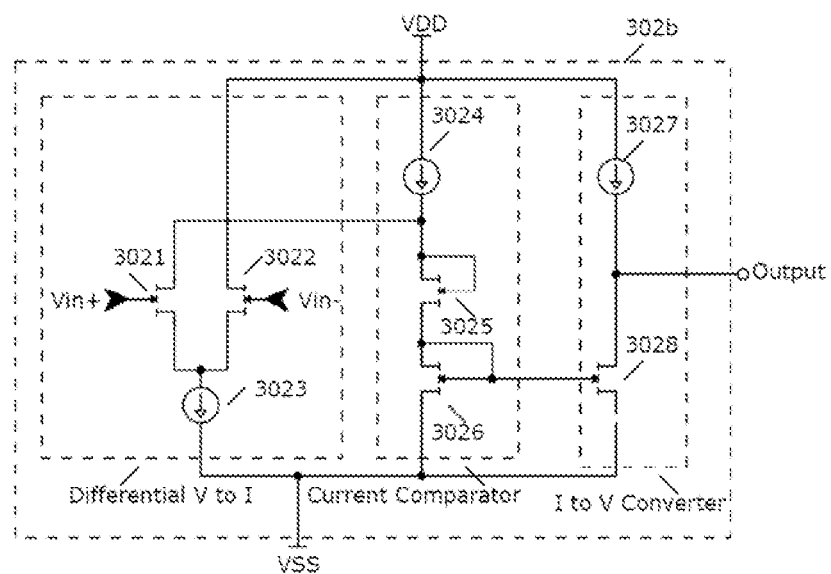

FIG. 34 and FIG. 35 illustrate two examples of comparators (302, 312) that are referred in previous embodiments. The comparator circuits receive the voltage measured in the respective circuits (Vds detection block or blanking circuit block or any other circuit) as one input signal and comprise a fixed reference voltage as another input. The reference voltages may be generated on chip or applied externally. However, it should be understood that these circuits 302*a* and 302*b* are merely provided as example configurations, and other circuit designs could be utilized in place of or in addition to these.

The comparator circuit 302*a* illustrated in FIG. 34 comprises an initial inverting differential amplifier stage 302*a*1, a transconductance amplifier stage 302*a*2 and a current subtractor stage 302*a*3. Differential amplifier 302*a*1 may be implemented using a differential pair (also known as longtailed pair) comprising two enhancement mode transistors, two resistors and a current source. The differential amplifier generally performs two main functions in this circuit. It provides amplification of the comparator differential input signal and sets the bias point for the next stage, biasing the transconductance amplifier stage 302a2 in a high gain region. The transconductance amplifier 302a2 receives a differential input voltage from the differential amplifier 302a1 and provides a differential current output (Ix, Iy) to the current subtractor stage 302a3. The transconductance amplifier comprises a differential pair with two enhancement mode transistors and current sources. The current subtractor stage may be implemented using current mirroring blocks such that when Ix-Iy is negative then $V_{out}$ is high, when Ix-Iy is positive then $V_{out}$ is low.

The transconductance amplifier stage and current subtractor stage allow a rail-to-rail comparator output. Rail-to-rail in this example refers to $V_{DD}$ as a high output and $V_{SS}$ as a low output.

FIG. 35 illustrates another example of the comparator circuits (302, 312). The comparator circuit 302b includes three stages-differential voltage to current conversion stage, current comparator stage, and a current to voltage converter stage. Differential voltage to current stage may be implemented using a differential pair of two enhancement mode transistors, and a current source. This stage receives the measured voltage from the respective circuit as one input and a predetermined voltage reference as the second input and converts them into respective current signals. The current comparator stage generates a differential current signal equivalent to the difference of the two inputs. The last stage converts this differential current to generate a voltage output. This example also allows a rail-to-rail comparator output. Rail-to-rail in this example refers to $V_{DD}$ as a high output and $V_{SS}$ as a low output.

Figure 36:
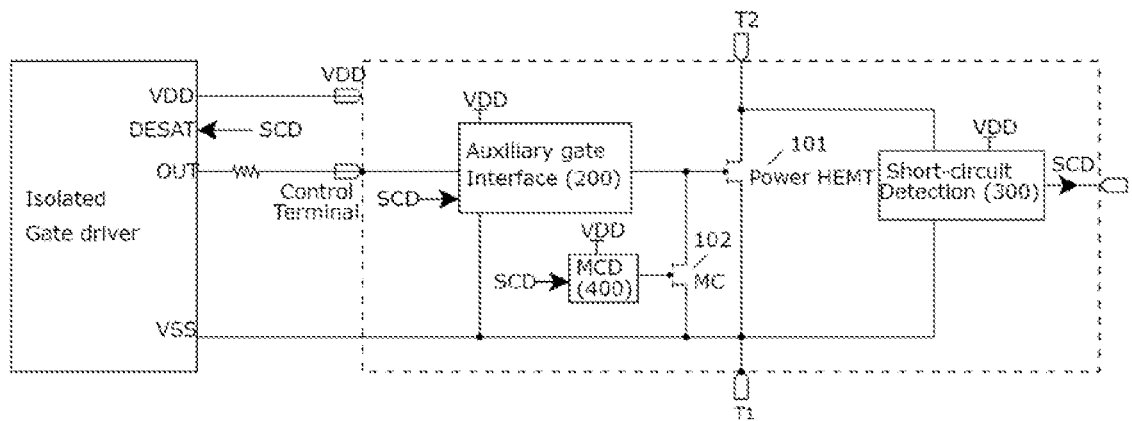
FIG. 36 illustrates a schematic example of the power integrated circuit connected to a gate driver.

FIG. 36 illustrates a schematic example of the power integrated circuit connected to a gate driver. The gate driver is configured to provide a gate driving signal (control signal) to the control terminal of the power IC. The gate driver and the power IC may be powered by a voltage supply VDD. The gate drivers in this example is provided with a DESAT pin that provides a desaturation protection function. This functionality is generally present in gate drivers for automotive inverter applications. When the voltage at the DESAT pin exceeds a threshold voltage, the driver initiates a safe-turn-off procedure to protect the power semiconductor switch. The short-circuit detection signal SCD may be connected to the DESAT input of the gate driver. When a short-circuit event occurs, the SCD signal goes HIGH, acting on the auxiliary gate interface circuit and/or Miller clamp driver to internally protect the power HEMT as illustrated in the above embodiments. At the same time, this signal also triggers the fault detection at the DESAT pin for the driver to initiate safe turn-off. The blanking time circuit of the short-circuit detection block help in avoiding unintentional tripping of the DESAT protection.

Figure 37:
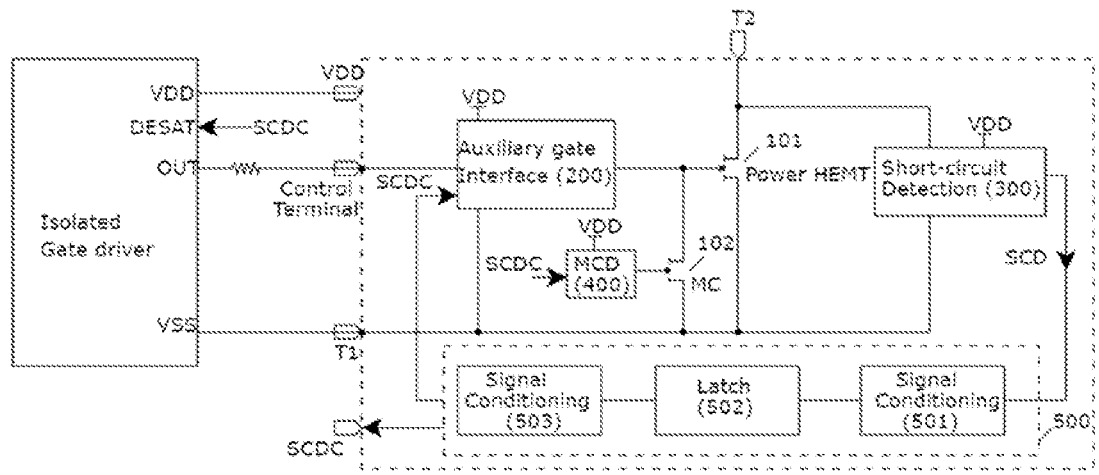
FIG. 37 illustrates another example of the connection between the power integrated circuit and the gate driver.

FIG. 37 illustrates another example of the connection between the power integrated circuit and the gate driver. In this implementation, the SCD signal is conditioned through the combination of signal conditioning blocks that are part of 500 as illustrated in previous embodiments. The conditioned signal SCDC is applied to the DESAT pin of the driver and also to the auxiliary gate interface (200) and/or Miller clamp driver (400).

Figure 38:
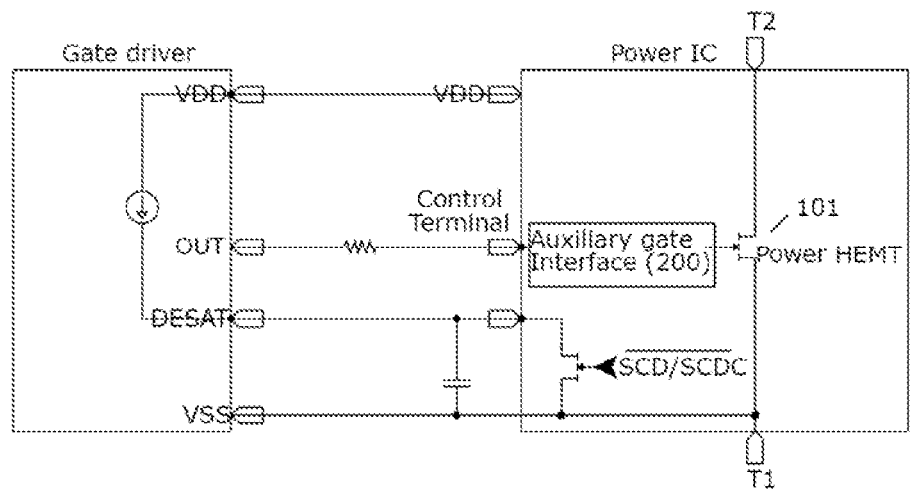
FIG. 38 illustrates an additional example of a short circuit event in the power IC may be reported to a gate driver with a DESAT function.

FIG. 38 illustrates an additional example of how a short circuit event in the power IC may be reported to a gate driver with a DESAT function. In this example, the power IC may have an open drain output when a short circuit event is occurring. The open drain pin may be implemented by using a pull-down transistor as illustrated which is ON when a short circuit event is not occurring, and OFF when a short circuit event is occurring. This open drain pin may be connected to the DESAT pin of a gate driver. The gate driver may comprise an internal pull-up component, for example a current source as illustrated in FIG. 38. When the output of the power IC is open drain the gate driver can pull-up this node. A capacitor may be connected to this node to set the time taken to pull up this node to a given voltage, this may be necessary to avoid oscillations and false triggering of the gate driver protection function. When the voltage on the DESAT pin exceeds an internal reference value of the gate driver then the gate driver may provide a low OUT signal in order to turn-off the power IC and protect the power HEMT. Note that this protection loop implemented through the gate driver may be too slow to protect the power HEMT and as such the on-chip protection circuit described in previous examples is still required.

Figure 39:
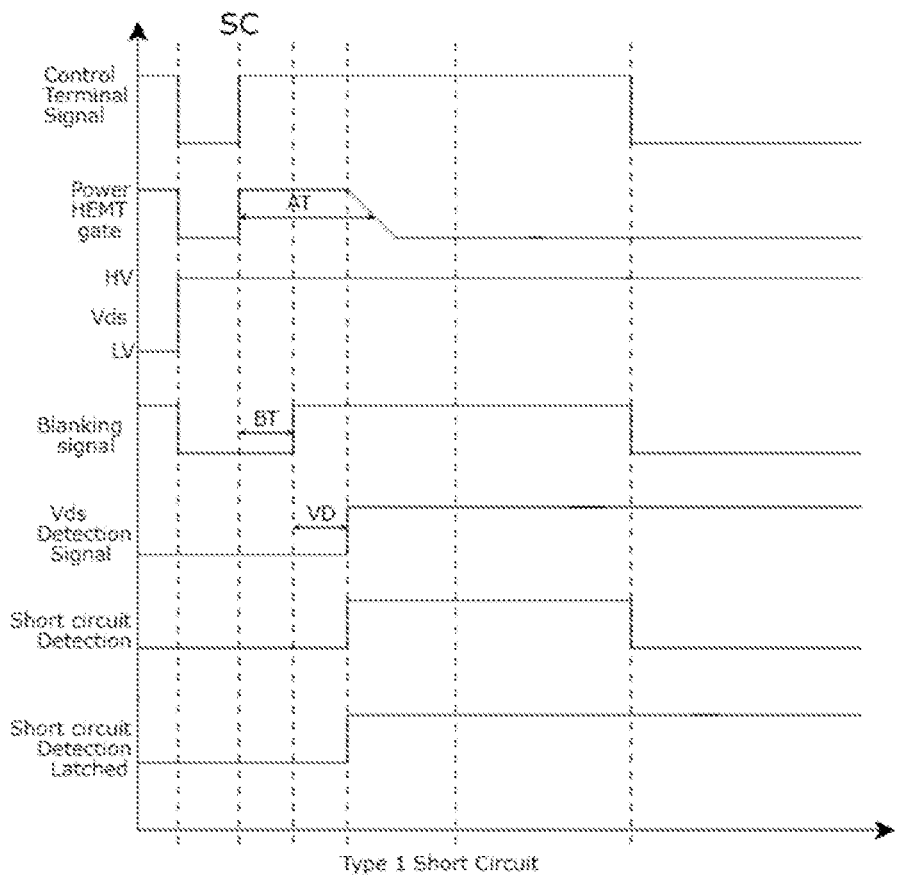
FIG. 39 illustrates timing graph of the sequence of pulses in the event of a type-1 short-circuit event.

FIG. 39 illustrates a timing graph of the sequence of pulses in the event of a type-1 short-circuit event. This activates the blanking time circuit and after the lapse of the predefined blanking time, the output of the blanking time circuit turns HIGH. The blanking time signal turning HIGH may enable the VDS detector as illustrated in FIG. 7, which turns HIGH if Vds across the device exceeds a set reference value. The HIGH SCD signal (or a conditioned version of the SCD signal) pulls down the gate of the power HEMT through the auxiliary gate interface circuit and/or the Miller clamp even though the external gate driver output may be HIGH. This saves the power HEMT device from the high current due to the short-circuit event and avoids device failure. As illustrated in FIG. 19, the SCD signal may be passed through a series of signal conditioning blocks and a latch circuit. The latch circuit 502 may hold the SCD signal HIGH based on a time-dependent and/or until a signal-dependent condition is met. This conditioned signal (or SCD signal directly) may be reported off-chip (for example as input to the DESAT pin of a gate driver) to initiate the safe turn-off procedure of the gate driver/controller in the system as shown in FIG. 37 and FIG. 36.

Practically there may be a delay between the short circuit detection and the turn-off of the power HEMT. This should be minimised as much as possible.

Similarly, delays between other signals illustrated in FIG. 39 may be present. As discussed these delays may be minimised though the monolithic integration of the circuit blocks presented to enable overall faster short circuit detection and protection.

Figure 40:
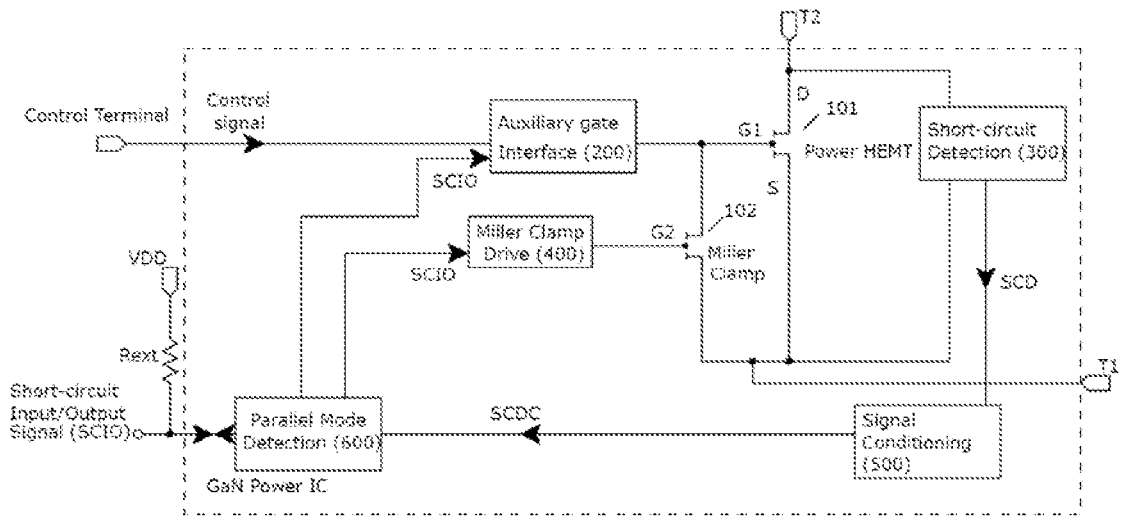
FIG. 40 illustrates power integrated circuits enabled for short-circuit detection in parallel connections.

FIG. 40 illustrates another aspect of the present disclosure where the power integrated circuits may be enabled for short-circuit detection in parallel connections. During paralleling implementation, the power ICs can communicate with each other when one of the devices detects a short-circuit condition. The power IC is provided with a short-circuit input/output pin (SCIO) which is connected to VDD and is HIGH during normal operation. All the power ICs connected in parallel have their SCIO pins connected to each other. In addition, the power ICs may include a parallel mode detection block (600) that helps to take action on the respective IC based on the other ICs connected in parallel.

Figure 41:
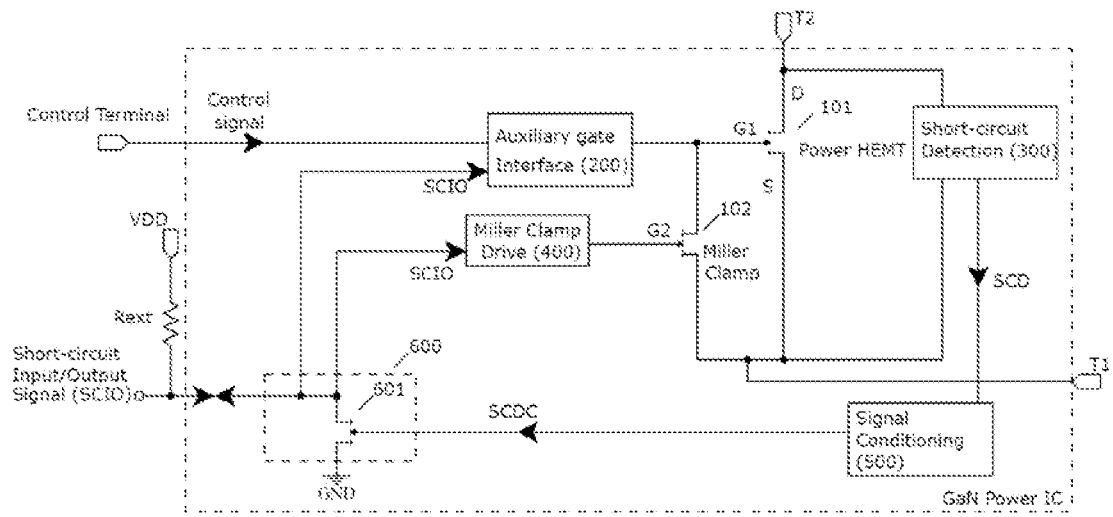
FIG. 41 illustrates an example comprising a parallel mode detector block comprising an e-mode HEMT device with its drain connected to a SCIO pin.

As an example, the parallel mode detector block may comprise an e-mode HEMT device with its drain connected to SCIO pin as shown in FIG. 41. During normal operation the SCIO pin is at the same voltage as VDD and the SCIO signal is HIGH.

In the event of a short-circuit condition, the SCD output of the short-circuit detection block 300 would be HIGH as illustrated in previous embodiments. The SCD signal may be conditioned in a signal conditioning block or directly applied to the parallel mode detector block 600. The HIGH signal at the gate of HEMT 601 will turn ON the HEMT pulling down the SCIO pin to ground. The SCIO signal may be further conditioned to act on the respective auxiliary gate interface and/or Miller clamp drive of the power IC or may be applied directly to the auxiliary gate interface and/or the Miller clamp drive based on whether these circuits need inverted signal or not. The further conditioning circuits may be included in the parallel mode detector block 600 or the auxiliary gate interface 200/Miller clamp drive 400. This SCIO signal will be communicated to the other parallel power ICs through the SCIO connection as shown in FIG. 42.

Figure 42:
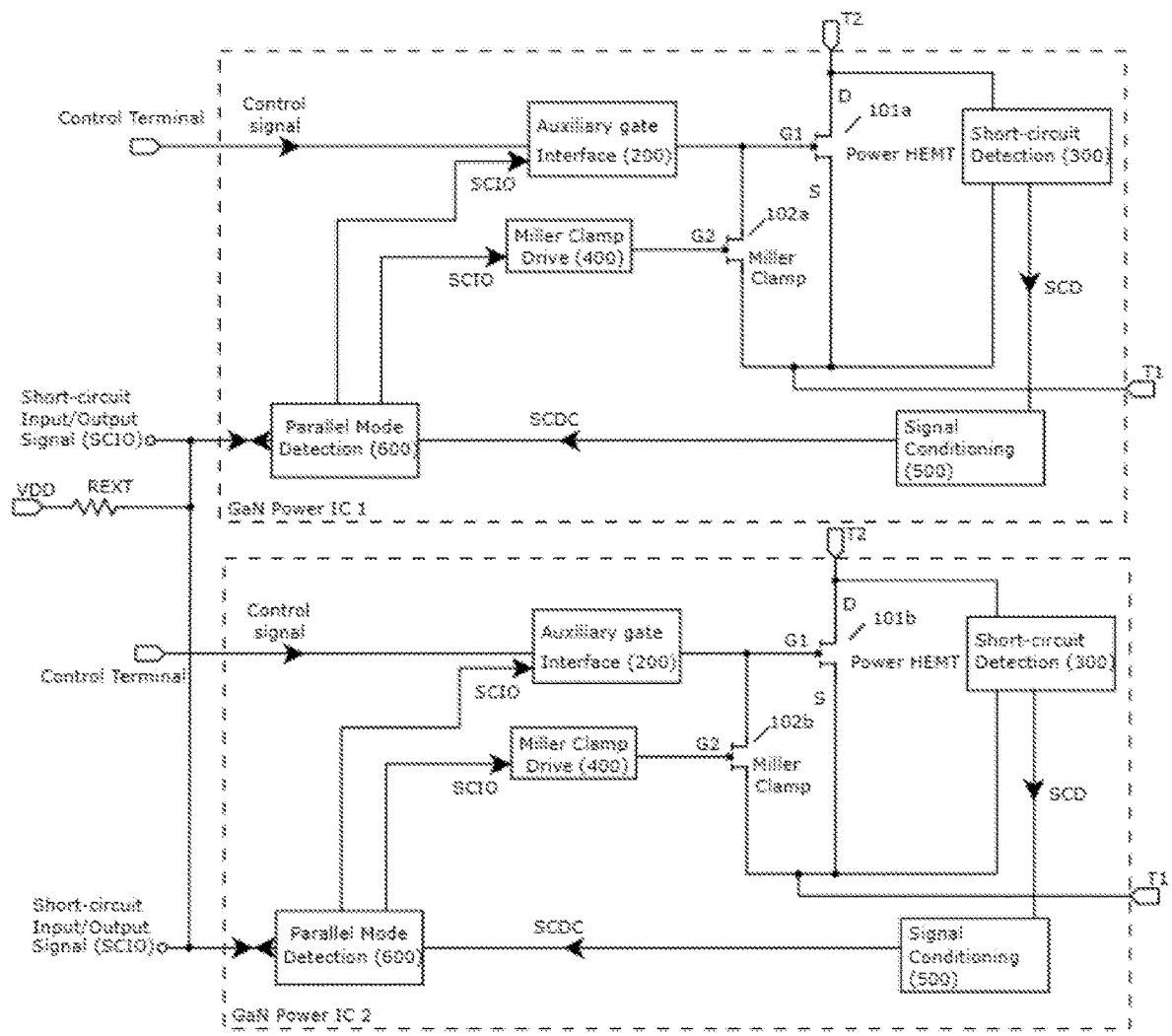
FIG. 42 illustrates an example of the parallel implementation showing two power ICs connected in parallel to each other.

FIG. 42 illustrates an example of the parallel implementation showing two power ICs connected in parallel to each other. As illustrated above, if for example power IC 1 detects a short-circuit condition, it pulls down the SCIO pin to ground. This is communicated to the parallel mode detection block of the power IC 2 through the SCIO pin that turns the SCIO signal of the IC 2 also to LOW. This in turn acts on the auxiliary gate interface and/or Miller clamp drive of the power IC 2 to turn off the power HEMT. In this way, all the power HEMTS of the ICs connected in parallel can be turned off at the same time through the SCIO connection. The SCIO pin may also be used to communicate to the external driver/controller about the short-circuit event for appropriate action.

Figure 43:
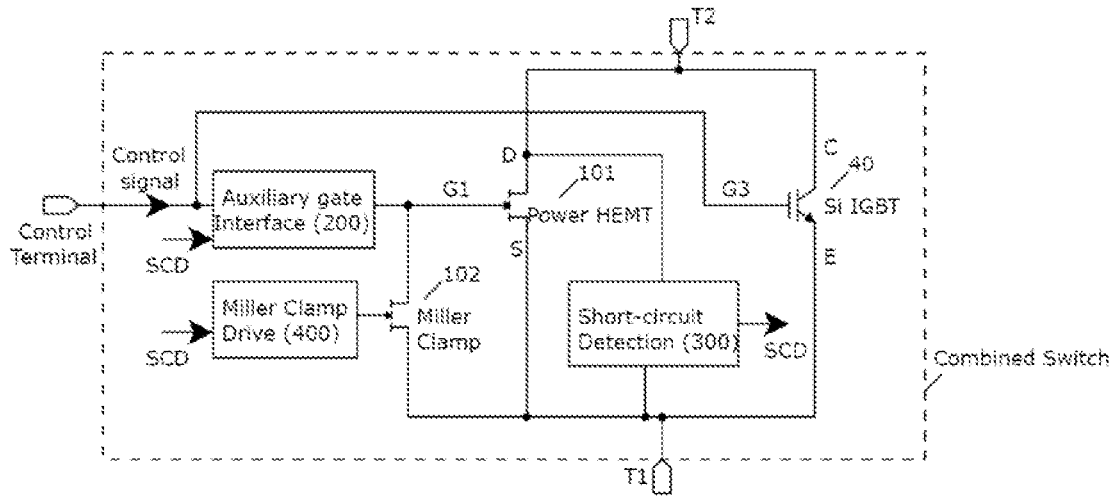
FIG. 43 illustrates another example of the power integrated circuit where the power HEMT switch is replaced by a combined switch that comprises of a high voltage transistor in parallel with the high voltage power HEMT device.
Figure 44:
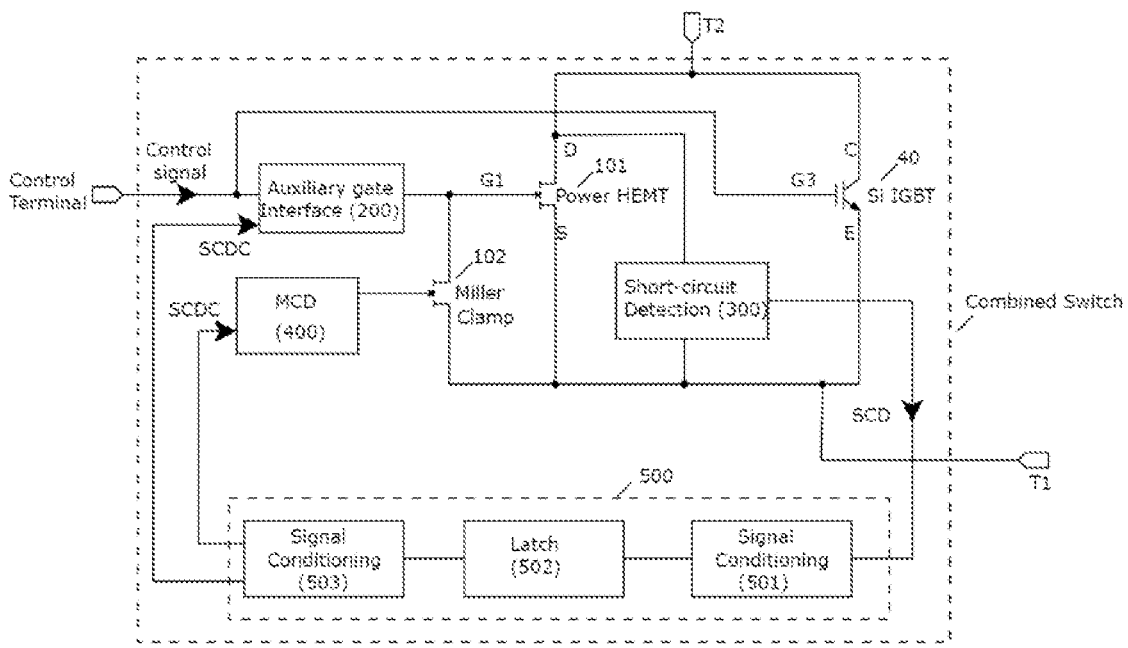
FIG. 44 illustrates an example in which the SCD signal is conditioned through a series of signal conditioning blocks before providing as an input to the auxiliary gate interface and the Miller clamp drive.

FIG. 43 illustrates another example of the power integrated circuit where the power HEMT switch is replaced by a combined switch that comprises of a high voltage transistor (40) in parallel with the high voltage power HEMT device (101). The high voltage transistor device (40) may comprise a material, or materials system, other than a III-nitride material. In some examples, the high voltage transistor device is a silicon and/or silicon carbide transistor, for example but not limited to a Si IGBT, Si MOSFET, SiC MOSFET or superjunction MOSFET. In general, the devices listed have relatively longer short-circuit withstand times (also known as endurance times) in the range of a few microseconds while GaN HEMTs can survive only for a few hundred nanoseconds (especially if the rail voltage-dc link—is higher and closer to their rated voltage). The short-circuit detection circuit is connected across the power HEMT device and outputs a HIGH SCD signal in the event of a short-circuit condition as illustrated in previous embodiments. This SCD signal is input to the auxiliary gate interface and/or the Miller clamp drive to turn-off or regulate the gate voltage of the power HEMT until the external driver turns off the control terminal. Reducing the bias of the gate terminal of the power HEMT may be beneficial in extending the time for which the power HEMT can survive a short circuit event, as a reduced gate bias can lead to the saturation current of the power HEMT in a short circuit condition event. Thus, the short-circuit detection and protection circuit of the HEMT device may extend the overall short circuit withstand time for the combined switch. The SCD signal may be conditioned through a series of signal conditioning blocks (500) before providing as an input to the auxiliary gate interface and the Miller clamp drive as shown in FIG. 44.

Figure 45:
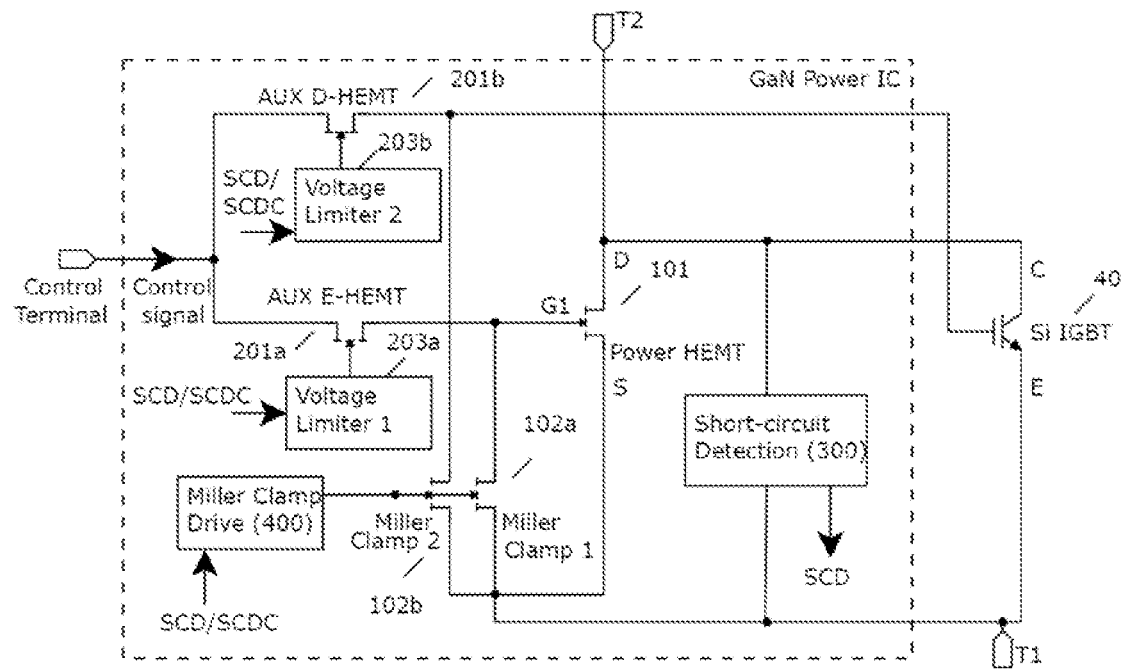
FIG. 45 illustrates an alternative example of the implementation of a short-circuit detection and protection in a combined switch comprising a high voltage GaN HEMT device in parallel with a high voltage device of another material.

FIG. 45 illustrates an alternative example of the implementation of a short-circuit detection and protection in a combined switch comprising a high voltage GaN HEMT device in parallel with a high voltage device of another material (e.g. Si IGBT, Si MOSFET, SiC MOSFET, superjunction MOSFET, etc). This implementation provides internal protection to the IGBT switch (40) also. An auxiliary depletion mode HEMT (d-HEMT) (201*b*) is connected between the control terminal and the gate of the high voltage IGBT (40). The gate of the auxiliary d-HEMT (201*b*) is connected to a voltage limiter (203*b*) to control the voltage applied to the gate of the auxiliary d-HEMT switch. Additionally, a Miller Clamp (102*b*) is connected between the gate and the emitter of the IGBT (40) like the Miller Clamp (102*a*) connected between the gate and the source of the power HEMT (101). However, the Miller Clamp 102*b* may be biased to operate up to 15-20V as needed by the IGBT. In this circuit if the short-circuit detection circuit 300 identifies a short-circuit event and turns the SCD signal HIGH. The SCD/SCDC signal would act on both the Miller clamps 102*a* and 102*b*, and both the voltage limiters 203*a* and 203*b* to regulate or pull down the gate voltage of both the power HEMT and the IGBT providing on-chip protection from the short-circuit event until the external driver may act to turn off the control terminal.

Figure 46:
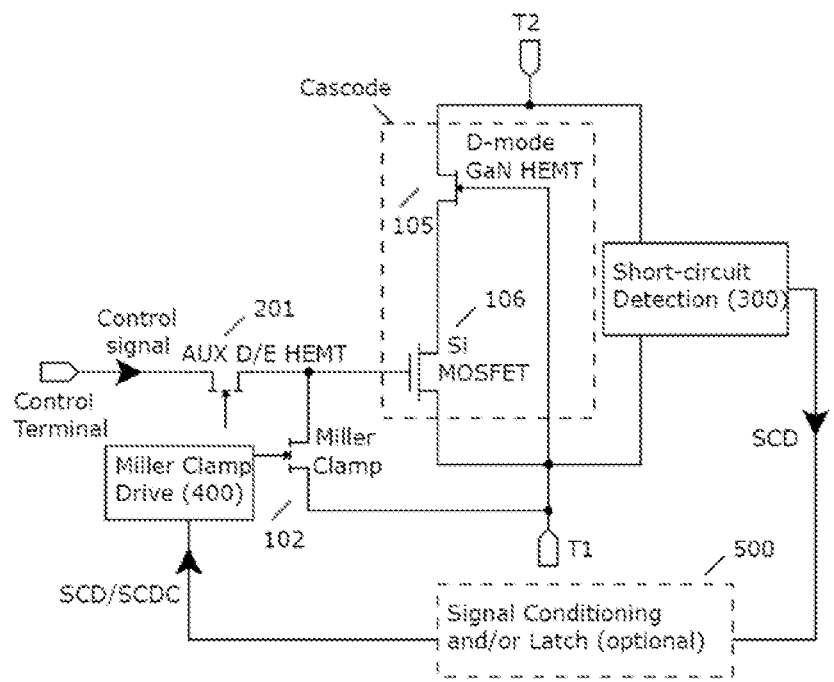
FIG. 46 illustrates another aspect of the present disclosure where instead of a power HEMT the short-circuit detection circuit may be integrated with a Cascode switch.

FIG. 46 illustrates another aspect of the present disclosure where instead of a power HEMT the short-circuit detection circuit may be integrated with a cascode switch. The Cascode device comprises a MOSFET (106) in series with a depletion mode GaN HEMT (105). The gate of the depletion mode GaN HEMT (105) is connected to the source of the MOSFET (106). The MOSFET (106) could be preferably an n-channel MOSFET in vertical or quasi-vertical configuration and its blocking voltage should be much smaller than that of the depletion mode HEMT. For example, the MOSFET blocking voltage could be 40 V for a 650V HEMT. The short-circuit detection circuit would monitor the voltage across the high voltage terminal and low voltage terminal of the cascode switch to identify a short-circuit event as illustrated in previous embodiments. The SCD signal may be conditioned through the combination of signal conditioning blocks (500) or may be directly applied to the Miller clamp drive to pull down the gate of the cascode switch to turn it off. Alternatively or in addition to the Miller clamp drive, the SCD or SCDC signal may be applied to the auxiliary gate interface to protect the cascode switch from the short-circuit condition (though this is not shown in the figure merely for simplicity).

Figure 47:
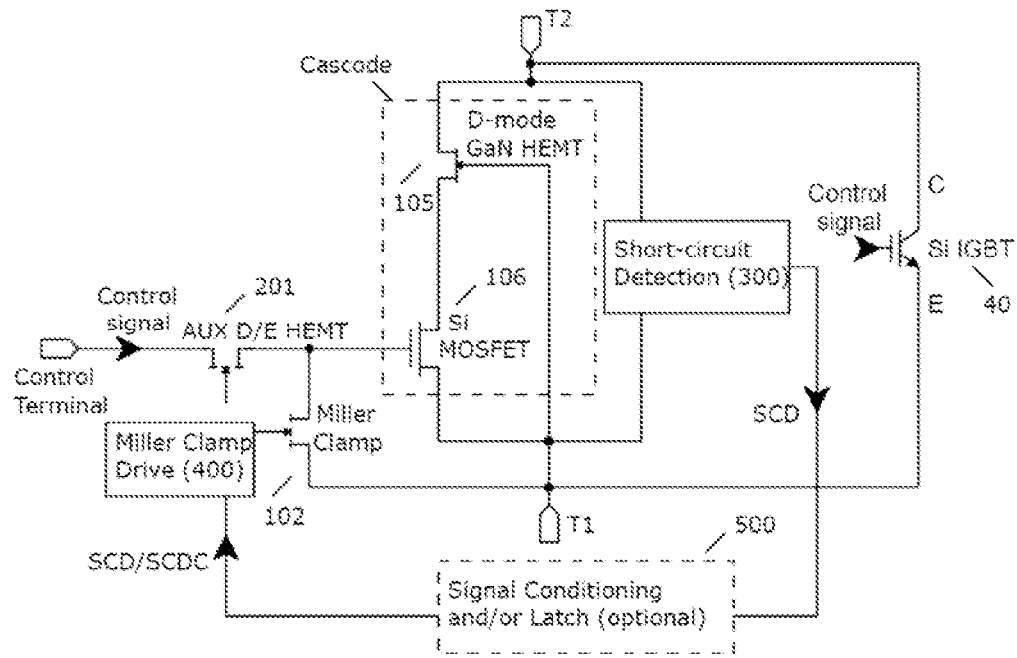
FIG. 47 illustrates another aspect of the previous embodiment where there is provided a combined switch which comprises a Cascode device in parallel with a high voltage device.

FIG. 47 illustrates another aspect of the previous embodiment where there is provided a combined switch which comprises a Cascode device in parallel with a high voltage device (40), wherein the high voltage device can be an IGBT, a silicon carbide MOSFET or superjunction. The Cascode device comprises a MOSFET (106) in series with a depletion mode GaN HEMT (105). The gate of the depletion mode GaN HEMT (105) is connected to the source of the MOSFET (106). The MOSFET (106) could be preferably an n-channel MOSFET in vertical or quasi-vertical configuration and its blocking voltage should be much smaller than that of the depletion mode HEMT. For example, the MOSFET blocking voltage could be 40 V for a 650V HEMT. The gate of the MOSFET (106) could be shorted to the gate of the high voltage switch (40) (e.g. IGBT) and further connected to the control terminal of the combined switch. Alternatively, either of the gates could be connected to the control terminal via slew rate structures (which could be simply resistors or resistors with diodes).

The short-circuit detection circuit would monitor the voltage across the high voltage terminal and low voltage terminal of the cascode switch to identify a short-circuit event as illustrated in previous embodiments. The SCD signal may be conditioned through the combination of signal conditioning blocks (500) or may be directly applied to the Miller clamp drive to pull down the gate of the cascode switch to turn it off. Alternatively or in addition to the Miller clamp drive, the SCD or SCDC signal may be applied to the auxiliary gate interface to protect the power HEMT from the short-circuit condition (though this is not shown in the figure merely for simplicity). The SCD/SCDC signal could also be communicated to the external driver as illustrated in previous embodiments to initiate a safe-turn-off of the device which will protect the cascode switch along with the high voltage device in parallel.

Figure 48:
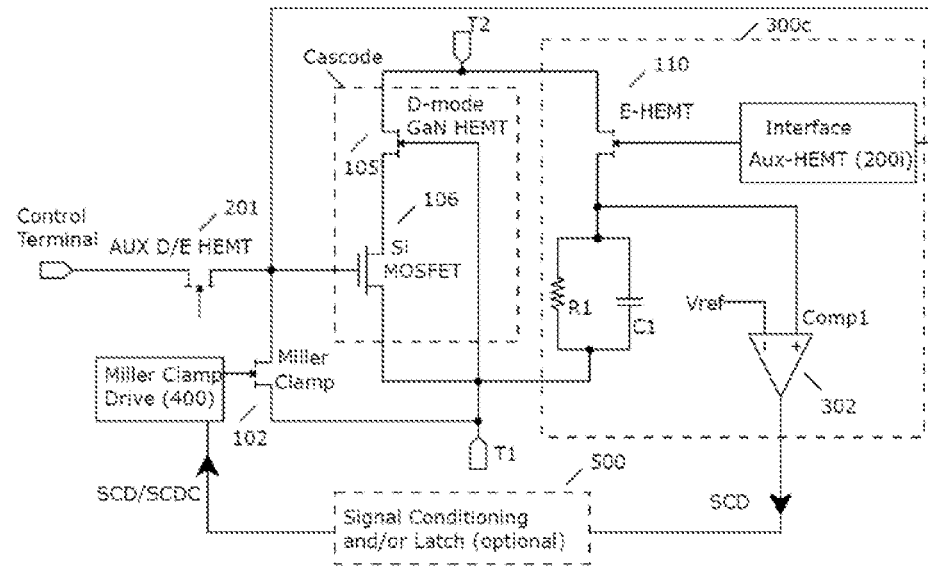
FIG. 48 illustrates an example implementation of the short circuit detection circuit shown in FIG. 46.

FIG. 48 illustrates an example implementation of the short circuit detection circuit shown in FIG. 46. This may be implemented in the example shown in FIG. 47. The short-circuit detection circuit 300c in this example comprises an enhancement mode HEMT 110 that acts as a sense HEMT, an RC network (R1, C1) and a comparator 302. The e-HEMT 110 is additionally provided with an auxiliary gate interface circuit 200i to adapt the driving voltage at the gate of the e-HEMT to be within a specific range (for example 0 to 7V) while the driving voltage on the control terminal could be from 0V to 20 V. The cascode switch may additionally have a high voltage Si switch in parallel as shown in FIG. 47.

This circuit 300c operates like the short-circuit detection circuit illustrated in FIG. 8. The SCD or SCDC signal may be applied to the auxiliary gate interface (though this is not shown in the figure merely for simplicity) and/or the Miller clamp drive to protect the cascode switch from the short-circuit condition. The SCD/SCDC signal would also be communicated to the external driver as illustrated in previous embodiments to initiate a safe-turn-off of the device which will protect the cascode switch along with the high voltage device in parallel.

Figure 49:
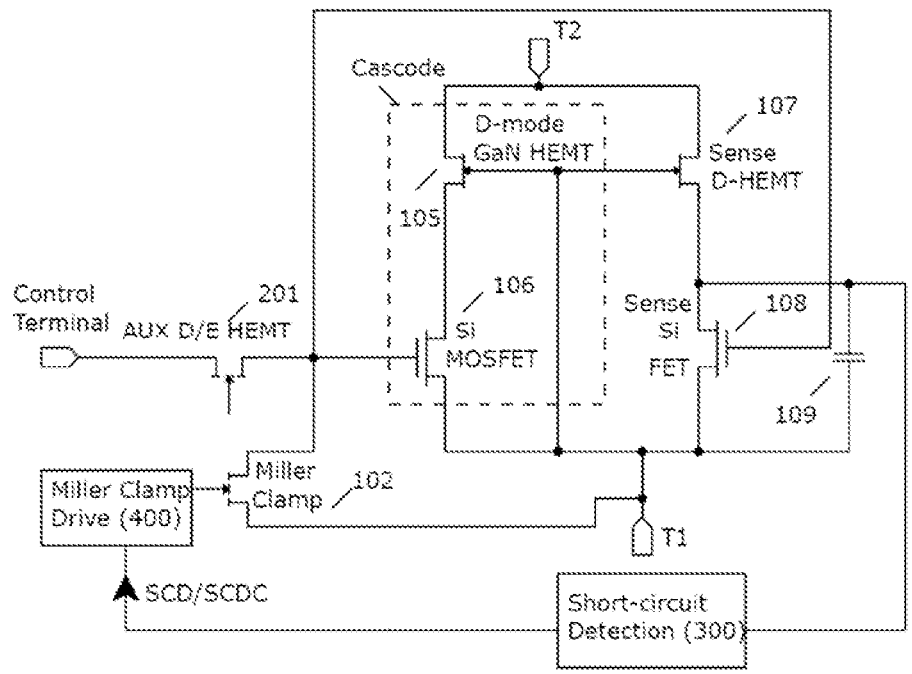
FIG. 49 illustrates an alternative example of the implementation of a sense transistor with a short-circuit detection circuit for a Cascode switch.

FIG. 49 illustrates an alternative example of the implementation of a sense transistor with a short-circuit detection circuit for a cascode switch. The sense transistor comprises of a sense HEMT (107) in GaN chip and a Sense FET (108) in silicon chip. The capacitor in parallel with sense FET 108 provides the function of a blanking circuit and the rate of charge and discharge of the capacitor determines the timing of the SCD signal. The cascode switch may additionally have a high voltage Si switch in parallel as shown in FIG. 47.

Figure 50:
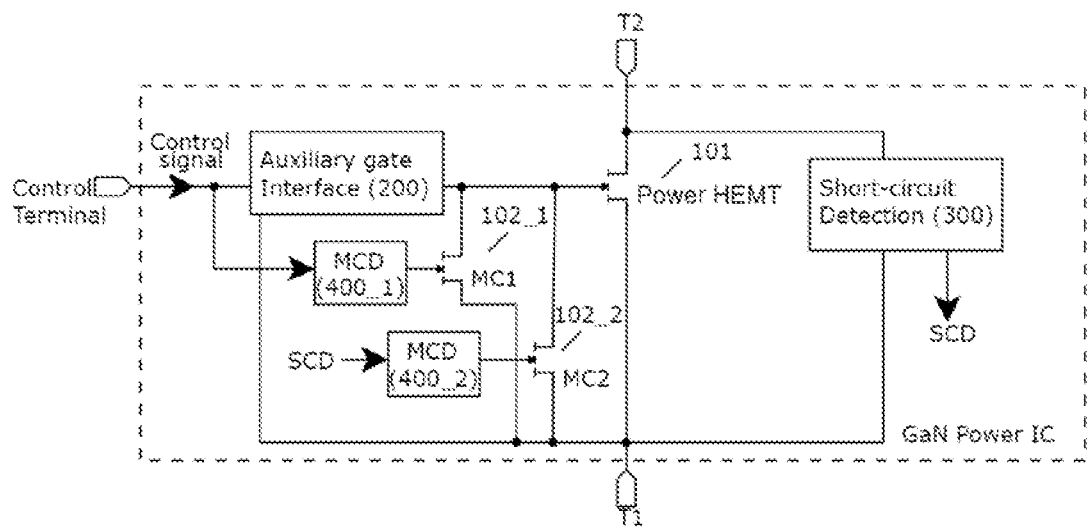
FIG. 50 illustrates an example of a power IC comprising at least one additional transistor connected in the same configuration as the Miller clamp HEMT.

In another example illustrated in FIG. 50, it may be desirable for the power IC to comprise at least one additional transistor 102_2 connected in the same configuration as the Miller clamp HEMT described in previous embodiments. The additional transistor may also be described as a Miller clamp HEMT or may be described as a pull down HEMT. It may be desirable to have two transistors connected in the same manner as they may be optimised for different functions. One of the Miller clamp transistors (102_1) may be optimised to enable fast turn-off the power HEMT and/or to avoid a false turn-on of the power HEMT during regular operation of the power electronics circuit. In this case, it may be preferable for the Miller clamp transistor to have a low on-state resistance, for example <10Ω. The second transistor (102_2) may be optimised to turn-off the power HEMT when a short circuit is detected, to protect the device as described in previous examples. In this case it may be preferable for the transistor to have a higher on-state resistance (e.g. >10Ω) than the Miller clamp transistor intended to operate during regular operation of the device. This may be desirable in order to slow down the turn-off of the power HEMT and avoid any overvoltage across the power HEMT (for example between its drain and source terminals) due to parasitics in the circuit, for example due to a L*dI/dt voltage being generated across parasitic inductances in the power loop.

Figure 51:
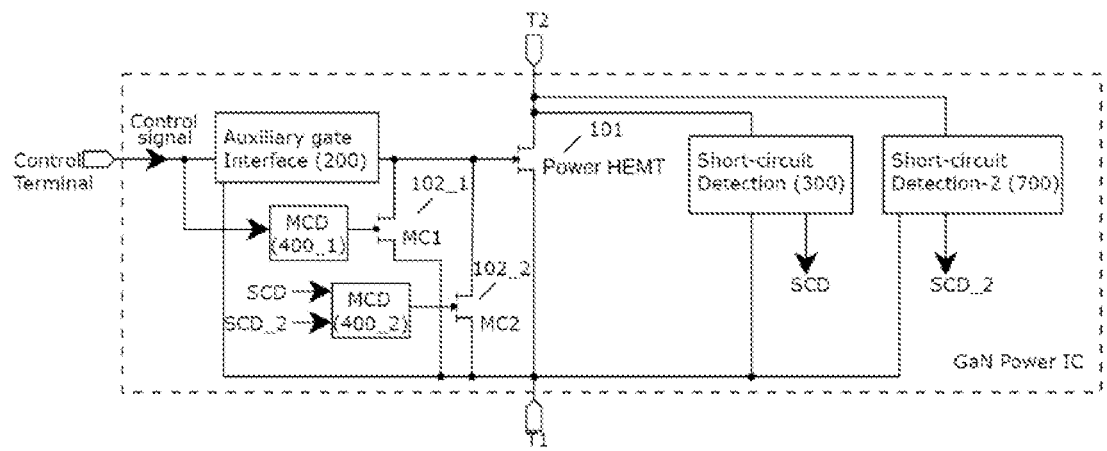
FIG. 51 illustrates an example comprising an additional circuit block which is optimised to protect the device in the event of a type 2 short circuit.

In one example illustrated in FIG. 51, an additional circuit block (700) may be included which is optimised to protect the device in the event of a type 2 short circuit. Type 2 short circuit may present a higher risk of failure of the device as during a type 2 short circuit event a fast positive dv/dt appears across the drain-to-source terminals of the power HEMT. This dv/dt can pull up the voltage on the gate of the power HEMT through the Miller capacitance (Cgd). This can shorten the maximum time for which the power HEMT can withstand a short circuit event, as the higher gate voltage results in a higher saturation current in the power HEMT and therefore to increased power dissipation. Additionally, an increase gate voltage may be a problem in itself for the power HEMT. For certain technologies, such as p-GaN gates the acceptable window of gate bias is quite narrow and exceeding a given voltage bias (e.g. 7.5V) may result in damage to the gate.

The type 2 protection circuit block can be designed to detect a fast dv/dt event in order to trigger the protection of the device as opposed to the previous examples which rely on a blanking time and Vds exceeding a given value. FIG. 51 illustrates the implementation of this type 2 detection circuit along with double Miller Clamp based protection mechanism illustrated in FIG. 50. It may be understood that this is only one example and this detection block 700 may be implemented with any of the protection mechanisms illustrated in previous examples.

Figure 52:
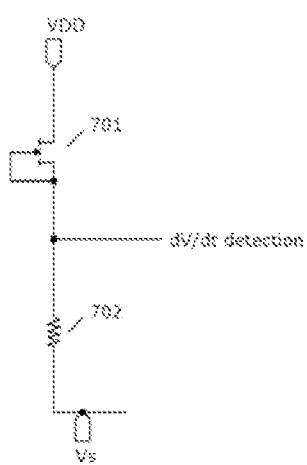
FIG. 52 illustrates an example dv/dt event detection circuit that may form a part of the type 2 short-circuit detection block.

FIG. 52 illustrates an example dv/dt event detection circuit that would be a part of the type 2 short-circuit detection block 700. This circuit would be connected between the drain and source of the power HEMT and the output may be connected to the Miller clamp to protect the power HEMT in case of the detection of a dv/dt event. The circuit may be connected to additional clamping transistor similar to FIG. 51 or it may be connected to the standard Miller clamp as shown in previous embodiments or it may be connected to a further additional clamping transistor provided in the block 700.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

REFERENCES

[1] https://www.powerelectronicsnews.com/ultrafast-discrete-short-circuit-protection-for-gan-hemts
[2] https://ieeexplore.ieee.org/document/9861995
[3] U.S. Pat. No. 10,818,786
[4] US 2023/0131602 A1

The invention claimed is:

1. A semiconductor switch comprising:
a first main terminal;
a second main terminal;
a control terminal;
a III-nitride high-electron-mobility transistor (HEMT), the III-nitride HEMT comprising a first source terminal, a first drain terminal, and a first gate terminal;
a first interface circuit operatively connected to the control terminal and to the first gate terminal; and
a short-circuit detection circuit operatively connected to the first drain terminal and the first source terminal, the short-circuit detection circuit configured to sense a short-circuit across the first drain terminal and the first source terminal and transmit a short-circuit detection signal to the first interface circuit, the first interface circuit being configured, upon receipt of the short-circuit detection signal, to cause the III-nitride HEMT to turn off, and/or to cause a voltage across the first gate terminal to be reduced, the short-circuit detection circuit comprising:
a voltage detection circuit configured to compare a voltage across the first drain terminal and the first source terminal with a reference voltage, and to output a high voltage detection signal when the voltage across the first drain terminal and the first source terminal is above the reference voltage; and
a blanking time circuit configured to output a blanking time signal after a blanking time period has elapsed, wherein the short-circuit detection circuit is configured to transmit the short-circuit detection signal based on the high voltage detection signal and the blanking time signal.

2. The semiconductor switch according to claim 1, wherein the first interface circuit comprises a pull-down transistor, the pull-down transistor comprising a second source terminal and a second drain terminal; wherein the second drain terminal is operatively connected to the first gate terminal; wherein the second source terminal is operatively connected to the first source terminal; and wherein the pull-down transistor is configured, when the first interface circuit receives the short-circuit detection signal, to turn on.

3. The semiconductor switch according to claim 2, wherein the pull-down transistor comprises a second gate terminal, wherein the first interface circuit is configured to receive the short-circuit detection signal at the second gate terminal.

4. The semiconductor switch according to claim 2, wherein the pull-down transistor comprises a second gate terminal, and wherein the first interface circuit further comprises a pull-down transistor gate driver operatively connected to the second gate terminal and configured to drive the second gate terminal; wherein the first interface circuit is configured to receive the short-circuit detection signal at the pull-down transistor gate driver.

5. The semiconductor switch according to claim 1, wherein the first interface circuit comprises an auxiliary gate interface circuit, the auxiliary gate interface circuit comprising a voltage limiter and an auxiliary III-nitride HEMT, the auxiliary III-nitride HEMT comprising:
a third source terminal operatively connected to the first gate terminal;
a third drain terminal operatively connected to the control terminal; and
a third gate terminal operatively connected to the voltage limiter;
wherein the voltage limiter is configurable to limit a voltage across the first gate terminal and the first source terminal.

6. The semiconductor switch according to claim 5, wherein the first interface circuit is configured to receive the short-circuit detection signal at the auxiliary gate interface circuit; and wherein the first interface circuit is configured, upon receipt of the short-circuit detection signal, to cause the voltage across the first gate terminal to be reduced.

7. The semiconductor switch according to claim 5, wherein the auxiliary gate interface circuit is configurable to adjust a voltage applied to the control terminal to be operatively compatible with the first gate terminal.

8. The semiconductor switch according to claim 1, comprising a latch circuit configured to condition the short-circuit detection signal such that the short-circuit detection signal is held in a given state until one or more release conditions is met.

9. The semiconductor switch according to claim 8, wherein the one or more release conditions comprises expiry of a time period.

10. The semiconductor switch according to claim 1, comprising a conditioning circuit configured to condition the short-circuit detection signal.

11. The semiconductor switch according to claim 10, wherein the conditioning circuit comprises one or more of:
a diode;
a resistor;
a capacitor;
a logic inverter;
a buffer; and/or
a level shifter.

12. The semiconductor switch according to claim 1, wherein the short-circuit detection circuit comprises a desaturation circuit configured to detect a voltage drop across the first drain terminal and the first source terminal.

13. The semiconductor switch according to claim 12, wherein the voltage drop is between 5 V and 30 V.

14. The semiconductor switch according to claim 1, wherein the short-circuit detection circuit comprises a resistor-capacitor network and a sense HEMT, the sense HEMT comprising:
a fourth source terminal operatively connected to the RC network;
a fourth drain terminal operatively connected to the first drain terminal; and
a fourth gate terminal operatively connected to the first gate terminal.

15. The semiconductor switch according to claim 1, wherein the voltage detection circuit is configured to operate upon receipt of the blanking time signal.

16. The semiconductor switch according to claim 1, wherein the short-circuit detection circuit further comprises a logical combination circuit configured to receive the high voltage detection signal and the blanking time signal, and to output the short-circuit detection signal based on a combination of the high voltage detection signal and the blanking time signal.

17. The semiconductor switch according to claim 1, wherein the short-circuit detection circuit is monolithically integrated with the III-nitride HEMT.

18. The semiconductor switch according to claim 2, further comprising an additional pull-down transistor, the additional pull-down transistor comprising a fifth source terminal and a fifth drain terminal;
wherein the fifth drain terminal is operatively connected to the first gate terminal;

wherein the fifth source terminal is operatively connected to the first source terminal; and wherein the additional pull-down transistor is configured for control of the III-nitride HEMT in the absence of a short-circuit detection signal.

19. The semiconductor switch according to claim 18, comprising an additional pull-down transistor gate driver, and wherein the additional pull-down transistor comprises a fifth gate terminal, wherein the additional pull-down transistor gate driver is operatively connected to the fifth gate terminal and to the control terminal.

20. The semiconductor switch according to claim 1, comprising a second short-circuit detection circuit, wherein the second short-circuit detection circuit is configured to detect a positive change in voltage with time across the first drain terminal and the first source terminal; and wherein the second short-circuit detection circuit is configured to transmit a second short-circuit detection signal when the positive change in voltage with time exceeds a reference rate.

21. The semiconductor switch according to claim 20, wherein the second short-circuit detection circuit is configured to transmit the second short-circuit detection signal to the first interface circuit.

22. The semiconductor switch according to claim 1, wherein the semiconductor switch comprises one or more of:
a cascode device; and/or
a combined switch comprising a III-nitride switch in parallel to a high-voltage transistor switch made up of a material other than III-nitride.

23. A system comprising the semiconductor switch according to claim 1, the system further comprising an external gate driver operatively connected to the control terminal, wherein the short-circuit detection circuit is configured to transmit a short-circuit detection signal to the external gate driver; wherein the external gate driver is configured, upon receipt of the short-circuit detection signal, to cause the semiconductor switch to turn off.

24. The semiconductor switch according to claim 8, wherein one of the one or more release conditions comprises receipt, by the short-circuit detection circuit, of a reset signal from the external gate driver.

25. A system comprising a plurality of semiconductor switches according to claim 1 connected in parallel;
wherein a first semiconductor switch of the plurality of semiconductor switches comprises a first parallel mode detection circuit;
wherein a second semiconductor switch of the plurality of semiconductor switches comprises a second parallel mode detection circuit;
wherein the short-circuit detection circuit of the first semiconductor switch is configured to transmit the short-circuit detection signal to the first parallel mode detection circuit;
wherein the first parallel mode detection circuit is configured, upon receipt of the short-circuit detection signal, to transmit a detection signal to the second parallel mode detection circuit; and
wherein the second parallel mode detection circuit is configured, upon receipt of the detection signal, to cause the second semiconductor switch to turn off.

26. A semiconductor switch comprising
a first main terminal;
a second main terminal;
a control terminal;
a III-nitride high-electron-mobility transistor (HEMT), the III-nitride HEMT comprising a first source terminal, a first drain terminal, and a first gate terminal;
a first interface circuit operatively connected to the control terminal and to the first gate terminal; and
a short-circuit detection circuit operatively connected to the first drain terminal and the first source terminal, the short-circuit detection circuit configured to:
sense a short-circuit across the first drain terminal and the first source terminal; and
transmit a short-circuit detection signal to the first interface circuit, the first interface circuit being configured, upon receipt of the short-circuit detection signal, to cause the III-nitride HEMT to turn off, and/or to cause a voltage across the first gate terminal to be reduced,
wherein the first interface circuit comprises an auxiliary gate interface circuit, the auxiliary gate interface circuit comprising a voltage limiter and an auxiliary III-nitride HEMT, the auxiliary III-nitride HEMT comprising:
a third source terminal operatively connected to the first gate terminal;
a third drain terminal operatively connected to the control terminal; and
a third gate terminal operatively connected to the voltage limiter;
wherein the voltage limiter is configurable to limit a voltage across the first gate terminal and the first source terminal.

* * * * *